(12) United States Patent
Shimizu

(10) Patent No.: US 9,431,246 B2
(45) Date of Patent: Aug. 30, 2016

(54) SEMICONDUCTOR DEVICE WITH LOW CONTACT RESISTANCE SIC REGION

(71) Applicant: Kabushiki Kaisha Toshiba, Minato-ku (JP)

(72) Inventor: Tatsuo Shimizu, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 65 days.

(21) Appl. No.: 14/107,552

(22) Filed: Dec. 16, 2013

(65) Prior Publication Data

US 2014/0183561 A1    Jul. 3, 2014

(30) Foreign Application Priority Data

Dec. 27, 2012   (JP) ................. 2012-286137

(51) Int. Cl.

| | |
|---|---|
| *H01L 29/06* | (2006.01) |
| *H01L 21/265* | (2006.01) |
| *H01L 21/02* | (2006.01) |
| *H01L 21/04* | (2006.01) |
| *H01L 29/66* | (2006.01) |
| *H01L 29/739* | (2006.01) |
| *H01L 29/78* | (2006.01) |
| *H01L 29/10* | (2006.01) |
| *H01L 29/16* | (2006.01) |

(Continued)

(52) U.S. Cl.
CPC ... *H01L 21/26506* (2013.01); *H01L 21/02529* (2013.01); *H01L 21/046* (2013.01); *H01L 21/283* (2013.01); *H01L 29/1095* (2013.01); *H01L 29/1608* (2013.01); *H01L 29/41* (2013.01); *H01L 29/66068* (2013.01); *H01L 29/7395* (2013.01); *H01L 29/7802* (2013.01)

(58) Field of Classification Search
CPC ............... H01L 29/1608; H01L 21/02529
USPC ........................................... 257/77
See application file for complete search history.

(56) References Cited

U.S. PATENT DOCUMENTS

| | | |
|---|---|---|
| 2004/0119076 A1 | 6/2004 | Ryu |
| 2010/0314629 A1 | 12/2010 | Tarui et al. |
| 2011/0175111 A1 | 7/2011 | Harada et al. |

FOREIGN PATENT DOCUMENTS

| | | |
|---|---|---|
| CN | 102171827 A | 8/2011 |
| JP | 8-8210 A | 1/1996 |

(Continued)

OTHER PUBLICATIONS

Satoshi Tanimoto, et al., "Practical Device-Directed Ohmic Contacts in 4H-SiC", The Institute of Electronics, Information and Communication Engineers Transactions on Electronics (in Japanese), vol. J86-C, No. 4, Apr. 2003, 9 pages.

(Continued)

*Primary Examiner* — Marc Armand
*Assistant Examiner* — Tifney Skyles
(74) *Attorney, Agent, or Firm* — Oblon, McClelland, Maier & Neustadt, L.L.P.

(57) ABSTRACT

According to one embodiment, a semiconductor device includes a first semiconductor part and a conductive electrode. The first semiconductor part is made of SiC. The SiC contains a first element as an n-type or p-type impurity. The first semiconductor part has a first interface part. The first interface part is configured to have maximum area density of the first element. The c conductive electrode is electrically connected to the first interface part.

19 Claims, 19 Drawing Sheets

(51) Int. Cl.
*H01L 21/283* (2006.01)
*H01L 29/41* (2006.01)

(56) References Cited

FOREIGN PATENT DOCUMENTS

| | | | |
|---|---|---|---|
| JP | 2004-158702 A | 6/2004 |
| JP | 2009-182271 A | 8/2009 |
| JP | 2010-87397 A | 4/2010 |
| JP | 2012-64658 A | 3/2012 |
| KR | 10-2010-0105767 A | 9/2010 |
| KR | 10-2011-0061641 A | 6/2011 |
| TW | 200423415 A | 11/2004 |
| WO | 2010/134344 A1 | 11/2010 |

OTHER PUBLICATIONS

Office Action issued Mar. 18, 2015 in Korean Patent Application No. 10-2013-0161505 (with English language translation).
Office Action issued Aug. 27, 2015 in Korean Patent Application No. 10-2013-0161505 (with English language translation).
Combined Office Action and Search Report issued Mar. 1, 2016 in Chinese Patent Application No. 201310729398.8 (with English translation).
Office Action issued on Feb. 11, 2016 in Korean Patent Application No. 10-2013-0161505 with partial unedited computer generated English translation.
Combined Taiwanese Office Action and Search Report issued Oct. 13, 2015 in Patent Application No. 102144635 (with English language translation).
Office Action mailed Jun. 21, 2016 in Japanese Patent Application No. 2012-286137 (with English Machine Translation).

SEMICONDUCTOR DEVICE WITH LOW CONTACT RESISTANCE SIC REGION

CROSS-REFERENCE TO RELATED APPLICATIONS

This application is based upon and claims the benefit of priority from Japanese Patent Application No. 2012-286137, filed on Dec. 27, 2012; the entire contents of which are incorporated herein by reference.

FIELD

Embodiments described herein relate generally to a semiconductor device and a method for manufacturing the same.

BACKGROUND

In semiconductor devices, the n-type region and the p-type region each need to be brought into low resistance contact with a metal. In the case of an element based on silicon (Si), the sum of the barriers between the n-type region and the p-type region on one hand and the same metal on the other is equal to the magnitude of the band gap, which is approximately 1 electron volt (eV). In this case, by increasing the concentration of dopants in both regions, a sufficiently low contact resistance is obtained. That is, in a Si-based element, the barrier is sufficiently low, and the dopant can be sufficiently introduced and activated.

In the case of an element based on silicon carbide (SiC), the sum of the barriers between the n-type region and the p-type region on one hand and the metal on the other reaches the magnitude of the band gap, which is approximately 3 eV. In a semiconductor device based on SiC, it is very difficult to obtain a low contact resistance between the semiconductor region and the electrode.

DETAILED DESCRIPTION

Figure 1:
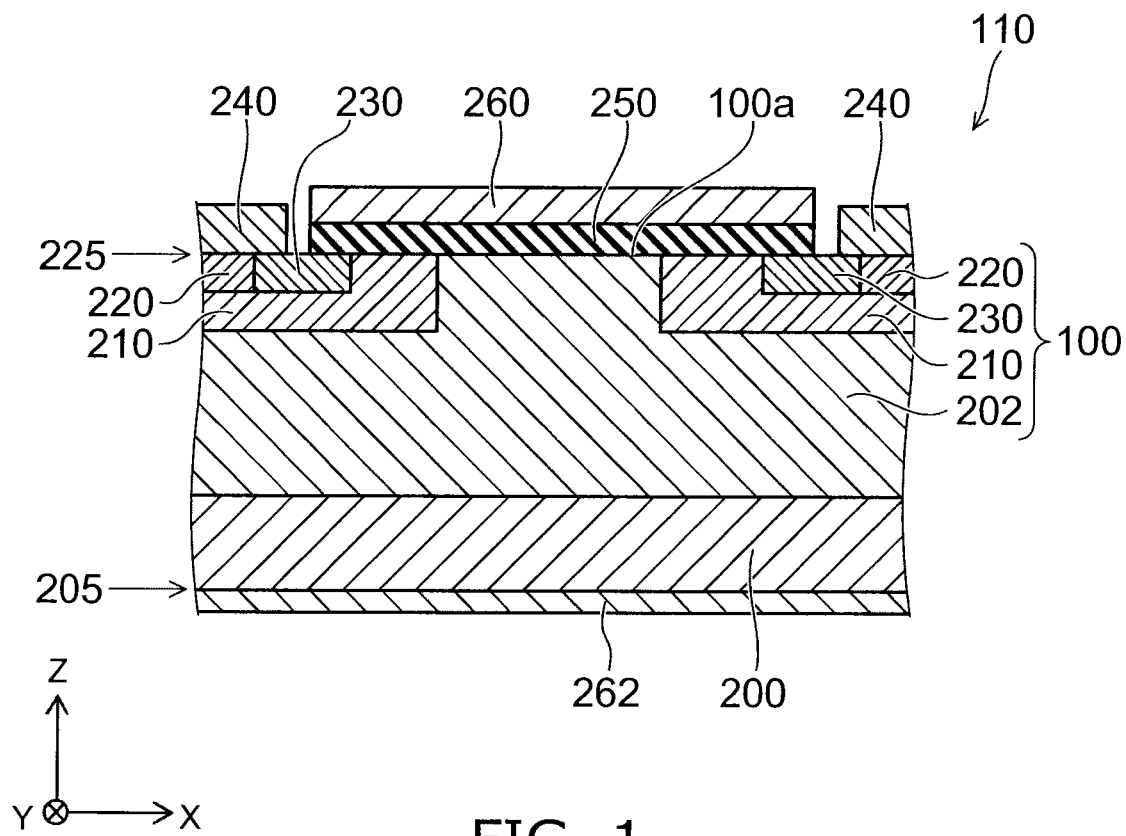
FIG. 1 is a schematic sectional view illustrating the configuration of a semiconductor device according to a first embodiment.

In general, according to one embodiment, a semiconductor device includes a first semiconductor part and a conductive electrode. The first semiconductor part is made of SiC. The SiC contains a first element as an n-type or p-type impurity. The first semiconductor part has a first interface part. The first interface part is configured to have maximum surface density of the first element. The c conductive electrode is electrically connected to the first interface part.

Various embodiments will be described hereinafter with reference to the accompanying drawings. In the following description, like members are labeled with like reference numerals, and the description of the members once described is omitted appropriately.

In the following description, the notations of $n^+$, n, $n^-$ and $p^+$, p, $p^-$ represent relative magnitude of impurity concentration in each conductivity type. That is, $n^+$ represents relatively higher n-type impurity concentration than n, and $n^-$ represents relatively lower n-type impurity concentration than n. Similarly, $p^+$ represents relatively higher p-type impurity concentration than p, and $p^-$ represents relatively lower p-type impurity concentration than p.

First Embodiment

FIG. 1 is a schematic sectional view illustrating the configuration of a semiconductor device according to a first embodiment.

The semiconductor device 110 according to the first embodiment shown in FIG. 1 includes a substrate 200, a first semiconductor region 202, a second semiconductor region 210, a third semiconductor region 230, a fourth semiconductor region 220, a first electrode 240, a second electrode 262, a control electrode 260, and an insulating film 250.

In the semiconductor device 110, the substrate 200, the first semiconductor region 202, the second semiconductor region 210, the third semiconductor region 230, and the fourth semiconductor region 220 include SiC (silicon carbide). The semiconductor device 110 is e.g. a DiMOSFET (double implanted metal oxide semiconductor field effect transistor).

The substrate 200 is e.g. a SiC substrate of n-type ($n^+$). The first semiconductor region 202 is an n-type ($n^-$) SiC semiconductor layer formed on the substrate 200. The first semiconductor region 202 is e.g. a breakdown voltage holding layer of the DiMOSFET.

The second semiconductor region 210 is provided on part of the first semiconductor region 202. The second semiconductor region 210 is a p-type ($p^-$) SiC semiconductor layer. The second semiconductor region 210 is e.g. a base region of the DiMOSFET.

The third semiconductor region 230 is provided on part of the second semiconductor region 210. The third semiconductor region 230 is an n-type (n$^+$) SiC semiconductor layer. The third semiconductor region 230 is e.g. a source region of the DiMOSFET.

The fourth semiconductor region 220 is provided on part of the second semiconductor region 210. The fourth semiconductor region 220 is juxtaposed with the third semiconductor region 230. The fourth semiconductor region 220 is a p-type (p$^+$) SiC semiconductor layer. The fourth semiconductor region 220 is a contact region with the second semiconductor region 210 (base region).

In this embodiment, the direction connecting the substrate 200 and the first semiconductor region 202 is referred to as Z direction (first direction). One of the directions orthogonal to the Z direction is referred to as X direction (second direction). The direction orthogonal to the Z direction and the X direction is referred to as Y direction (third direction).

In the semiconductor device 110, the first semiconductor region 202, the second semiconductor region 210, the third semiconductor region 230, and the fourth semiconductor region 220 constitute a structural body 100.

The structural body 100 has a first surface 100a. The first surface 100a is a surface of the structural body 100 on the opposite side from the substrate 200. The structural body 100 includes a portion in which the first semiconductor region 202, the second semiconductor region 210, and the third semiconductor region 230 are arranged in this order in the X direction. The structural body 100 includes a portion in which the first semiconductor region 202, the second semiconductor region 210, and the third semiconductor region 230 are arranged in this order in the Z direction.

The first semiconductor region 202, the second semiconductor region 210, and the third semiconductor region 230 are stacked in the Z direction in this order. Part of the first semiconductor region 202 is exposed to the first surface 100a. Part of the second semiconductor region 210 is exposed to the first surface 100a. Part of the third semiconductor region 230 is exposed to the first surface 100a. On the first surface 100a side of the structural body 100, part of the first semiconductor region 202, part of the second semiconductor region 210, and part of the third semiconductor region 230 are arranged in the X direction. Part of the second semiconductor region 210 is provided between part of the first semiconductor region 202 and part of the third semiconductor region 230.

In manufacturing the structural body 100, the second semiconductor region 210 is formed in a surface side portion of the first semiconductor region 202. The third semiconductor region 230 is formed in a surface side portion of the second semiconductor region 210.

The part of the second semiconductor region 210 provided between the part of the first semiconductor region 202 and the part of the third semiconductor region 230 on the first surface 100a side constitutes a portion functioning as a channel of the DiMOSFET.

The first electrode 240 is in contact with the third semiconductor region 230 and the fourth semiconductor region 220. The first electrode 240 includes a conductive material. The first electrode 240 is e.g. a source electrode of the DiMOSFET.

The second electrode 262 is in contact with the lower surface of the substrate 200. The second electrode 262 includes a conductive material. The second electrode 262 is e.g. a drain electrode of the DiMOSFET. The second electrode 262 is ohmically connected to the substrate 200.

In the configuration of the semiconductor device 110, the fourth semiconductor region 220 is e.g. a first semiconductor part. The third semiconductor region 230 is e.g. a second semiconductor part. The fourth semiconductor region 220 may be the second semiconductor part. The third semiconductor region 230 may be the first semiconductor part. In the description of this embodiment, it is assumed that the fourth semiconductor region 220 is the first semiconductor part, and the third semiconductor region 230 is the second semiconductor part.

The insulating film 250 is provided on the first surface 100a of the structural body 100. The insulating film 250 functions as a gate insulating film of the DiMOSFET. The insulating film 250 is provided along the first surface 100a. The insulating film 250 is provided on the first semiconductor region 202, the second semiconductor region 210, and the third semiconductor region 230.

The control electrode 260 is provided on the insulating film 250. The control electrode 260 functions as a gate electrode of the DiMOSFET.

In the semiconductor device 110, the fourth semiconductor region 220 contains an element as a p-type impurity. The p-type impurity element is at least one of boron (B), aluminum (Al), and germanium (Ge). In the fourth semiconductor region 220, the portion in which the surface density of the p-type impurity element is maximized exists in the range from the interface 225 between the fourth semiconductor region 220 and the first electrode 240 to a depth (distance in the Z direction) of 1 nanometer (nm) into the fourth semiconductor region 220. Normally, impurities are not collected at the interface. As shown later, by a special way of fabrication, the impurity is introduced in sites opposite to normal and develops a pinned state. Thus, impurities are collected at the interface by interaction with the metal. Here, the opposite site means that the impurity (B, Al, Ga) normally located in the Si site is located in the C site. For instance, in XPS (X-ray photoelectron spectroscopy) measurement of the interface, normally, Al—C bonds are dominant, and Al—Si bonds are not observed. In contrast, in the configuration of this embodiment, Al—Si bonds are observed.

In this semiconductor device 110, a low contact resistance is obtained between the fourth semiconductor region 220 and the first electrode 240.

In the semiconductor device 110, the third semiconductor region 230 contains an element as an n-type impurity. The n-type impurity element is at least one of nitrogen (N), phosphorus (P), and arsenic (As). In the third semiconductor region 230, the portion in which the surface density of the n-type impurity element is maximized exists in the range (first interface part) from the interface 225 between the third semiconductor region 230 and the first electrode 240 to a depth (distance in the Z direction) of 1 nm into the third semiconductor region 230. Normally, impurities are not collected at the interface. As shown later, by a special way of fabrication, the impurity is introduced in sites opposite to normal and develops a pinned state. Thus, impurities are collected at the interface by interaction with the metal. Here, the opposite site means that the impurity (P, As) normally located in the Si site is located in the C site. Alternatively, the opposite site means that the impurity (N) normally located in the C site is located in the Si site. For instance, in XPS measurement of the interface, normally, P—C bonds are dominant, and P—Si bonds are not observed. In contrast, in the configuration of this embodiment, P—Si bonds are observed. Alternatively, normally, N—Si bonds are dominant, and N—C bonds are not observed. In contrast, in the configuration of this embodiment, N—C bonds are observed.

In this semiconductor device 110, a low contact resistance is obtained between the third semiconductor region 230 and the first electrode 240. Thus, in the semiconductor device 110, the first electrode 240 is formed with low contact resistance for both the fourth semiconductor region 220 and the third semiconductor region 230.

The substrate 200 in contact with the second electrode 262 contains an element as an n-type impurity. The n-type impurity element is at least one of N, P, and As. In the substrate 200, the portion in which the surface density of the n-type impurity element is maximized exists in the range from the interface 205 between the substrate 200 and the second electrode 262 to a depth (distance in the Z direction) of 1 nm into the substrate 200. Normally, impurities are not collected at the interface. As shown later, by a special way of fabrication, the impurity is introduced in sites opposite to normal and develops a pinned state. Thus, impurities are collected at the interface by interaction with the metal. This point is similar to the impurities being collected at the interface 225 between the third semiconductor region 230 and the first electrode 240.

In this semiconductor device 110, a low contact resistance is obtained between the second electrode 262 and the substrate 200.

Here, the principle by which a low contact resistance is obtained between the semiconductor part including SiC and the electrode in the semiconductor device 110 is described.

In the semiconductor device 110 as described above, with the miniaturization of the pattern of each portion, it is desirable to form an electrode made of a single metal material and ohmically connected to both the third semiconductor region 230 and the fourth semiconductor region 220 in the semiconductor device 110.

Typically, the first electrode 240 made of the same metal material may be formed on the n-type third semiconductor region 230 and the p-type fourth semiconductor region 220. In this case, the third semiconductor region 230 made of n-type SiC has high on-resistance. On the other hand, in the fourth semiconductor region 220 made of p-type SiC, a resistor and a capacitor is effectively formed. This causes a problem in switching speed.

Furthermore, in view of the restriction of alignment accuracy and the simplification of the process, a technique for forming an electrode with low contact resistance by the same manufacturing process is required. That is, a technique for forming a contact electrode with low resistance from the same material on both the n-type third semiconductor region 230 and the p-type fourth semiconductor region 220 is required.

In this context, with regard to the contact with a large n-type SiC region, a good contact resistance is obtained by using an interface reaction layer in the high temperature process. However, with regard to the contact with a p-type SiC region, it is difficult to obtain a sufficiently low contact resistance even in a large region. This results from the material characteristics of the SiC material. This is because this material has a large band gap.

More specifically, with regard to the electrode in low resistance contact with the n-type SiC region, the barrier with respect to the p-type SiC region has a magnitude close to the band gap. Thus, in particular, in a semiconductor (wide band gap semiconductor) having a wider band gap than Si, it is difficult to obtain a low contact resistance between the p-type SiC region and the electrode.

A high contact resistance to the p-type SiC region results in a large RC time constant at the time of device operation. This decreases the operation speed. Furthermore, a high loss occurs in the case of an element in which a large amount of current flows in the p-type SiC region (e.g., IGBT (insulated gate bipolar transistor)).

In particular, in a structure including an n-type SiC region and a p-type SiC region adjacent to each other, the SiC regions may need to be kept equipotential. Then, by structure, an npn bipolar transistor is embedded. The operation of this bipolar transistor is controlled by inhibiting carrier injection from the n-type SiC region into the p-type SiC region.

In each process of ion implantation at high concentration (fabrication of $p^+$ and fabrication of $n^+$), formation of a sacrificial oxide film, and electrode formation at high temperature, a large amount of C defects are generated in the SiC substrate.

The inventor has performed first principle calculation as an approach for calculating electron states. According to this calculation, with reference to the case where the released Si forms Si bulk, generation of a Si defect requires an energy of 7-8 eV. Even near the SiC substrate surface, generation of a Si defect requires an energy of approximately 5 eV.

In contrast, with reference to the case where the released C forms C bulk, a C defect appears at an energy of approximately 4 eV. Furthermore, at the SiC substrate surface, a C defect appears at an energy as low as 0.75-2 eV. The reason for the generation of a large amount of C defects in the aforementioned process is that in the first place, C defects are generated easily at the SiC substrate surface, the interface between the SiC region and the insulating film (e.g., $SiO_2$), and the interface between the SiC region and the metal.

Here, the first principle calculation is based on the density functional approach using local density approximation. For Si, norm-preserving pseudopotentials are used. For substances other than Si such as C, ultrasoft pseudopotentials developed by Vanderbilt et al. are used.

Figure 2:
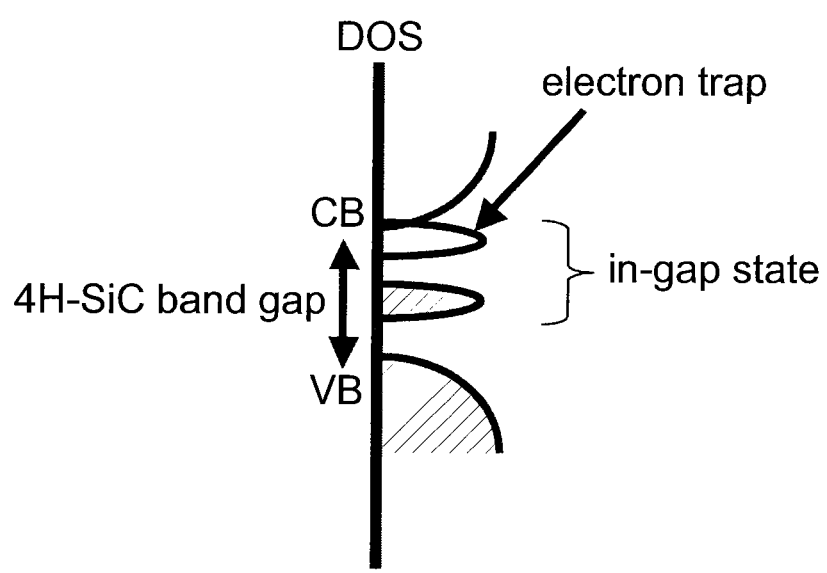
FIG. 2 illustrates the density of states.

FIG. 2 illustrates the density of states.

In FIG. 2, the vertical axis represents the density of states (DOS). As shown in FIG. 2, generation of C defects causes the occurrence of an in-gap state and the change of the band structure of the conduction band edge. This produces a local resistance change region. That is, C defects produce in-plane nonuniformity of current.

For improvement in device characteristics, it is important to make a cell with uniform in-plane resistance (bulk resistance and contact resistance). If the generated C defects remain, a local breakdown occurs, and the device fails to obtain a sufficiently long lifetime. Thus, it is necessary to reduce C defects near the interface in some way.

In this context, in order to consider the electron state of C defects in the SiC substrate, the electron state of C defects in SiC of the 4H structure (hereinafter referred to as "4H—SiC") was determined by first principle calculation. FIG. 2 shows the density of states of C defects in 4H—SiC.

If a C defect is generated in the SiC substrate, each of four Si around the C defect acquires one dangling bond. The dangling bond of Si has a state near the midpoint of the band gap of SiC. Thus, by interaction of dangling bonds of four Si around the C defect, states split into the bonding state and the antibonding state are formed in the gap.

However, in SiC, the energy position of the conduction band and the valence band varies with the structure. Therefore, the positional relationship in the gap between the bonding state and the antibonding state generated by interaction of dangling bonds of Si depends on the structure of SiC.

As shown in FIG. 2, in the 4H structure, the antibonding state is generated immediately below the conduction band. In this state, electrons are trapped. Thus, this state causes the decrease of mobility.

Here, the introduced position and activation of the dopant are described.

By this first principle calculation, the electron state was calculated in the case where B, Al, and Ga as p-type dopants and N, P, and As as n-type dopants are introduced in various sites.

In a brief summary, for B, Al, and Ga as p-type dopants and P and As as n-type dopants, the element located in the Si site forms a broad state and functions as a dopant. Furthermore, only for N as an n-type dopant, the element located in the C site forms a broad state and functions as a dopant. That is, in the normal most stable structure, each element functions as a dopant.

However, the inventor has newly found that if the substituent element is introduced in the site opposite from the normal site in which it functions as a dopant, the p-type dopant forms a localized state immediately above the valence band, and the n-type dopant forms a localized state immediately below the conduction band.

More specifically, B, Al, and Ga as p-type dopants and P and As as n-type dopants located in the C site form localized states, and do not function as dopants. Furthermore, N as an n-type dopant located in the Si site forms a localized state and does not function as a dopant. That is, an element introduced by substitution in the site opposite from the normal site in which it functions as a dopant forms a localized state and does not function as a dopant.

Here, if the dopant and Si are codoped, the dopant can be introduced in the C site. On the other hand, if the dopant and C are codoped, the dopant can be introduced in the Si site. This is used to select the state of the dopant from the localized state and the broad state.

Use of the localized state allows exchange of electrons between the electrode metal and the SiC region. As a result, the energy position of the electrode metal can be fixed (hereinafter referred to as "pinned") to the band edge of the SiC semiconductor band gap.

In n-type SiC, electrons are released from the localized state. Thus, the effective work function of the electrode metal is made shallower. Accordingly, the energy of the electrode metal is pinned to the edge position of the conduction band. This realizes a low contact resistance between n-type SiC and the electrode metal.

In p-type SiC, contrary to n-type SiC, electrons are moved from the electrode metal side to the localized state. Thus, the effective work function of the electrode metal is made deeper. Accordingly, the energy of the electrode metal is pinned to the edge position of the valence band. This realizes a low contact resistance between p-type SiC and the electrode metal.

Here, if annealing is performed in the situation in which the electrode metal exists on the SiC region, the localized states are collected near the interface between the SiC region and the electrode. If the electrode metal exists on the SiC region, then because of the energy gain of electron migration, the localized states are collected at the interface so that electrons can be exchanged with the electrode metal. However, even if annealing is performed in the situation in which the electrode metal does not exist on the SiC region, the localized states are not collected at the SiC surface because there is no energy gain of electron migration. That is, it is important to perform annealing after electrode formation. This annealing may double as electrode formation annealing. Here, normally, because there is no localized state, impurities are not collected at the interface even if annealing is performed after electrode formation.

Next, the mechanism of C defect generation is described.

In order to elucidate the mechanism of defect generation near the surface of the SiC substrate, the generation energy of a defect at the surface of the SiC substrate was determined by first principle calculation. The energy needed to generate a C defect at the outermost surface of the C surface of the SiC substrate is 0.75 eV. The energy needed to generate a Si defect at the outermost surface of the Si surface of the SiC substrate is 4.6 eV. The element at the outermost surface of the SiC substrate lacking hydrogen termination has dangling bonds. Thus, the element at the outermost surface is placed in a high energy state. Accordingly, it is found that the element at the outermost surface is easily detached and generates a defect.

Next, the generation energy of a defect in the SiC substrate was determined by first principle calculation. The energy needed for C defect generation is 4.0 eV. The energy needed for Si defect generation is 7.5 eV. Thus, it is found that in the SiC substrate, C defects are most likely to be generated.

Near the interface between the metal and the SiC substrate, and near the interface between the insulating film ($SiO_2$) and the SiC substrate, the defects are diffused into the SiC substrate while the internal elements (C and Si) and the defects generated at the surface interchange with each other. Thus, it is found that many defects are generated in the SiC substrate near the interface between the metal and the SiC substrate, and near the interface between the insulating film ($SiO_2$) and the SiC substrate.

As seen from the aforementioned generation energy of the C defect and the Si defect, a large amount of C defects are generated if dopants and the like are introduced by ion implantation. In any case, C defects are generated at at least $10^{17}/cm^3$ or more only by the normal MOSFET fabrication process. In many cases, it may be considered that C defects are generated at $10^{18}/cm^3$ or more.

Thus, many interface C defects are generated near the interface between the metal and the SiC substrate, and near the interface between the insulating film ($SiO_2$) and the SiC substrate. This causes variation in the current passing through the electrode in the MOSFET based on the 4H—SiC substrate.

In a SiC substrate formed by epitaxial growth, C defects are generated only at approximately $10^{13}/cm^3$. On the other hand, if ions such as dopants are implanted into this SiC substrate, C defects are sharply increased. Even at low dose, C defects reach $10^{17}/cm^3$. At high dose, C defects easily reach $10^{18}/cm^3$.

In the MOSFET based on the 4H—SiC substrate, interface states at $1\times10^{18}/cm^3$ or more have been reported. The C defect in the SiC substrate can exchange a maximum of four electrons. Thus, in terms of the amount of C defects, the interface states correspond to $2.5\times10^{17}/cm^3$ or more. For instance, the interface states are distributed approximately at $8.9\times10^{16}/cm^3$ ($2\times10^{11}/cm^2$ in terms of surface density) or more and $8.9\times10^{19}/cm^3$ ($2\times10^{13}/cm^2$ in terms of surface density) or less. In terms of the amount of C defects, this corresponds to $2.2\times10^{16}/cm^3$ or more and $2.3\times10^{19}/cm^3$ or less. However, the maximum should be considered as the aforementioned value of $8.9\times10^{19}/cm^3$ or less. This depends also on the film formation of the insulating film ($SiO_2$). C defects are similarly generated also by film formation of the insulating film ($SiO_2$), removal of the insulating film ($SiO_2$), and film formation of the electrode metal (Ni, Ti, Al, etc.).

As a result, the amount of C defects is $2.2 \times 10^{16}/\text{cm}^3$ or more and $8.9 \times 10^{19}/\text{cm}^3$ or less. In a more favorable process, the amount of C defects is suppressed to $2.2 \times 10^{16}/\text{cm}^3$ or more and $2.3 \times 10^{19}/\text{cm}^3$ or less.

In this embodiment, by codoping of dopants (B, Al, or Ga for p-type, or P or As for n-type) and Si, the C sites of the SiC substrate are filled with the dopants. Here, many of the C defects can be filled. Thus, the amount of C defects is suppressed to the extent comparable with a SiC film formed by epitaxial growth. These dopants are located in the C sites instead of the normal Si sites, and form localized states. Thus, these dopants are collected at the interface to constitute pinned sites.

Furthermore, in the case of N, codoping with C is performed. The codoped C fills the C defect. Thus, again, the amount of C defects is suppressed to the extent comparable with a SiC film formed by epitaxial growth. In any case, in this embodiment, the amount of C defects is sufficiently suppressed.

The result of the above investigation is as follows. In a semiconductor device in which a p-type SiC semiconductor part is connected to an electrode based on a conductive material, the surface density of the p-type dopant (at least one of B, Al, and Ga) is maximized in the interface part between the electrode and the p-type SiC semiconductor part connected thereto. Thus, a low contact resistance is obtained between the p-type SiC semiconductor part and the metal electrode. Here, the interface part between the semiconductor part and the electrode refers to the range from the interface between the semiconductor part and the electrode to a depth of approximately 1 nm into the semiconductor part. The interface part may be configured to be part of the semiconductor part, or to be provided between the semiconductor part and the electrode.

Furthermore, in a semiconductor device in which an n-type SiC semiconductor part is connected to an electrode based on a conductive material, the area density of the n-type dopant (at least one of N, P, and As) is maximized in the interface part between the electrode and the n-type SiC semiconductor part connected thereto. Thus, a low contact resistance is obtained between the n-type SiC semiconductor part and the metal electrode. Here, the p-type dopant and the n-type dopant described above may be any combination of the materials.

Furthermore, a low resistance contact can be obtained between the n-type SiC semiconductor part, the p-type SiC semiconductor part, and the metal by one electrode (made of the same material). Furthermore, in the contact with p-type SiC and the contact with n-type SiC, pinning at the interface is used. Thus, the dependence on the material of the metal in contact is very low. Thus, commonly-used electrode materials (TiN, W, polysilicon, Ni, etc.) can be used.

Furthermore, the in-plane distribution of the current passing through the interface between the metal and SiC is made uniform. This suppresses the current distribution between the device cells, and improves the reliability of the device. That is, the breakdown mode due to local flow of large current is suppressed.

In other words, the semiconductor device 110 according to this embodiment includes an electrode (e.g., first electrode 240) based on a conductive material, and a semiconductor part (e.g., fourth semiconductor region 220) connected to this electrode and including SiC containing at least one of B, Al, and Ga as a p-type impurity. In this semiconductor part, the portion in which the area density of the impurity is maximized exists in the interface part (the range (second interface part) from the interface 225 to a depth of approximately 1 nm into the semiconductor part) between the electrode and the semiconductor part.

Furthermore, the semiconductor device 110 according to this embodiment includes an electrode (e.g., first electrode 240, second electrode 262) based on a conductive material, and a semiconductor part (e.g., third semiconductor region 230, substrate 200) connected to this electrode and including SiC containing at least one of N, P, and As as an n-type impurity. In this semiconductor part, the portion in which the area density of the impurity is maximized exists in the interface part (from the interface 225 to a depth of approximately 1 nm into the semiconductor part) between the electrode and the semiconductor part.

Next, the area density of atoms at the interface is considered.

First, the lower limit is shown in detail.

The area density of the element at the outermost surface of 4H—SiC is approximately 2 atoms (a pair layer of Si and C)/area of a unit cell=2/(lattice constant a×lattice constant $a \times \sqrt{3}/2) = 2.4 \times 10^{15}/\text{cm}^2$.

If 5% or more dopants of the element at the outermost surface are piled up, pinning reliably occurs. Here, the lower limit of the amount of the "pinned material" is determined by the voltage shift amount required at the interface. For n-type, the voltage shift amount is approximately 0.1 V (so that the work function of the metal of 4.3 eV or more is turned to an effective work function smaller than 4.2 eV). For p-type, the voltage shift amount is approximately 1.7 V (so that the work function of the metal of only 5.7 eV or less is turned to an effective work function larger than 7.4 eV). The shift X (volts) resulting from the amount of the fixed polarization made of the interface between the metal and the SiC substrate is calculated as follows.

$$X = (\text{charge}) \times (\text{area density}) \times (\text{length of polarization})/\text{permittivity}$$

This is described in more detail as follows.

$$\begin{aligned} X \text{ (volts)} &= (\text{charge}) \times (\text{area density}) \times \\ &\quad (\text{length of polarization})/\text{permittivity} \\ &= (\text{charge } 2 \times 1.602 \times 10^{-19} \text{ Coulomb}) \times (\text{area density cm}^{-2}) \times \\ &\quad (\text{length of polarization} \times 10^{-8} \text{cm})/ \\ &\quad (\text{relative permittivity } \varepsilon)/[8.854 \times 10^{-12}](\text{farad/m})] \\ &= 1.81 \times 10^{-14} (\text{number area density in cm}^{-2}) \times \\ &\quad (\text{length of polarization in Å})/(\text{relative permittivity}) \end{aligned}$$

Here, the charge of the dopant in the SiC substrate is 1, the number area density is approximately $10^{13}$ cm$^{-2}$, and the relative permittivity is 10. Because the lower limit is considered, the length of polarization is set to its maximum, i.e., approximately 10 Å. Accordingly, the shift X is given as follows.

$$X = 1.81 \times 10^{-14} \times 1 \times 10^{13} \times 10/10 = 0.18 \text{ (V)}$$

For n-type, to obtain approximately 0.1 V, $0.56 \times 10^{13}$ cm$^{-2}$ or more is needed. For p-type, to obtain approximately 1.7 V, $9.4 \times 10^{13}$ cm$^{-2}$ or more is needed. Below these values, the required shift amount is not obtained, and the resistance is made higher.

Next, the upper limit is shown in detail.

If 50% dopants of the element at the outermost surface are piled up, a monolayer is replaced by the dopants. Substantially, at this stage, many C sites (Si sites only in the case of N) are replaced by the dopants. Thus, 50% ($1.22\times10^{15}$/cm$^2$) is sufficient.

From the above formula, the upper limit is determined. In view of determining the upper limit, the length of polarization is set to its minimum, i.e., approximately 2 Å. For n-type, it is sufficient that the shift amount at the interface be 1.5 V or less (so that the work function of 5.7 eV is turned to an effective work function smaller than 4.2 eV). Thus, the upper limit only needs to be $4.2\times10^{14}$ cm$^{-2}$ or less. For p-type, it is sufficient that the shift amount at the interface be 3.1 eV or less (so that the work function of 4.3 eV is turned to an effective work function larger than 7.4 eV). Thus, the upper limit only needs to be $8.7\times10^{14}$ cm$^{-2}$ or less. The upper limit shown herein is determined under the assumption that the length of polarization is approximately 2 Å. However, the length of polarization may be increased to approximately 10 Å. Thus, it is also sufficient that the upper limit be approximately 1/5 of the foregoing. It is preferable that the upper limit be as small as possible. Thus, for n-type, the upper limit only needs to be $8.4\times10^{13}$ cm$^{-2}$ or less. For p-type, it is sufficient that the upper limit be $1.7\times10^{14}$ cm$^{-2}$ or less.

In the semiconductor device 110, the area density of the impurity element (at least one of N, P, and As) in the interface part of the third semiconductor region 230 is $0.56\times10^{13}$ cm$^{-2}$ or more and $1.22\times10^{15}$ cm$^{-2}$ or less. Preferably, the area density is $0.56\times10^{13}$ cm$^{-2}$ or more and $4.2\times10^{14}$ cm$^{-2}$ or less. More preferably, the area density is $0.56\times10^{13}$ cm$^{-2}$ or more and $8.4\times10^{13}$ cm$^{-2}$ or less. Then, pinning to the band edge occurs. Thus, a low contact resistance structure of the n-type SiC semiconductor and the electrode is obtained.

In the semiconductor device 110, the area density of the impurity element (at least one of B, Al, and Ga) in the interface part of the fourth semiconductor region 220 is $9.4\times10^{13}$ cm$^{-2}$ or more and $1.22\times10^{15}$ cm$^{-2}$ or less. Preferably, the area density is $9.4\times10^{13}$ cm$^{-2}$ or more and $8.7\times10^{14}$ cm$^{-2}$ or less. More preferably, the area density is $9.4\times10^{13}$ cm$^{-2}$ or more and $1.7\times10^{14}$ cm$^{-2}$ or less. Then, pinning to the band edge occurs. Thus, a low contact resistance of the p-type SiC semiconductor and the electrode is obtained.

Next, a specific example of the semiconductor device 110 is described.

As shown in FIG. 1, in the semiconductor device 110, a plurality of second semiconductor regions 210 are provided on part of the surface of the first semiconductor region 202 and spaced from each other. The second semiconductor region 210 is selectively formed from the surface to a halfway depth of the first semiconductor region 202.

In one semiconductor device 110, two second semiconductor regions 210 are placed so as to sandwich a partial region of the first semiconductor region 202. On part of the surface of each second semiconductor region 210, a third semiconductor region 230 is provided. The third semiconductor region 230 is selectively formed from the surface to a halfway depth of the second semiconductor region 210.

On part of the surface of each second semiconductor region 210, a fourth semiconductor region 220 is provided adjacent to the third semiconductor region 230. Thus, a plurality of second semiconductor regions 210 are selectively formed on at least part of the first semiconductor region 202. The plurality of second semiconductor regions 210 are connected to the third semiconductor region 230 and the fourth semiconductor region 220.

In the example shown in FIG. 1, on part of the surface of the second semiconductor region 210, the third semiconductor region 230 and the fourth semiconductor region 220 adjacent to each other are placed. In one semiconductor device 110, two fourth semiconductor regions 220 are placed so as to sandwich two third semiconductor regions 230.

In other words, in one semiconductor device 110, the fourth semiconductor regions 220 are placed outside the third semiconductor regions 230. In each second semiconductor region 210, a channel region in electrical continuity with the first semiconductor region 202 is formed inside the third semiconductor regions 230.

An insulating film 250 is formed astride the portion from part of the surface of one of the two third semiconductor regions 230 to part of the surface of the other. The insulating film 250 is made of e.g. SiO$_2$. The insulating film 250 is formed in contact with part of the surface of the third semiconductor regions 230 on both sides, the surface of each second semiconductor region 210 where the third semiconductor region 230 and the fourth semiconductor region 220 are not formed, and the surface of the first semiconductor region 202 between the two second semiconductor regions 210 (interchannel region).

On the insulating film 250, a control electrode 260 is formed. The insulating film 250 is an example of the gate insulating film. Thus, the control electrode 260 is formed via the insulating film 250 astride the third semiconductor regions 230 on both sides, the partial region of each second semiconductor region 210 where the third semiconductor region 230 and the fourth semiconductor region 220 are not formed, and the first semiconductor region 202 between the two second semiconductor regions 210 (interchannel region). The control electrode 260 is a gate electrode.

Furthermore, a first electrode 240 is formed on another part of the surface of the third semiconductor region 230 and the surface of the fourth semiconductor region 220. The first electrode 240 is a source electrode.

Here, the fourth semiconductor region 220 contains at least one element (hereinafter referred to as "element A") of B, Al, and Ga. The portion in which the area density of the element A is maximized is provided in the interface part with the first electrode 240. The first electrode 240 is ohmically connected to the fourth semiconductor region 220. In the DiMOSFET, the fourth semiconductor region 220 is a contact region with the substrate 200.

In the fourth semiconductor region 220, if the element A is introduced in C sites near the interface, localized states are produced near the top of the valence band. To realize this, the element A and Si are introduced (coimplanted) near the interface. Furthermore, after the metal is connected, the element A located in the C sites is diffused (annealing after metal connection). Coimplantation may be performed simultaneously for the element A and Si. Alternatively, one of them may be implanted first. In a basic pattern used in this embodiment, the element A is implanted, and only in its surface portion, Si is implanted later.

This is because after the metal is connected to the fourth semiconductor region 220, electrons can migrate from the metal side to the interface localized states, and the entire system can be stabilized by the migration. This stabilization energy is a driving force for the pileup of the element A to the interface.

Here, if the metal is not connected to the fourth semiconductor region 220, electrons cannot migrate. Thus, the element A cannot be collected to the surface. That is, the mere existence of the element A is insufficient. The element A needs to form localized states, and to be subjected to diffusion annealing after connection to the metal.

Because of the aforementioned stabilization energy due to electron migration, annealing for diffusing the element A is performed in a low temperature process at approximately 700° C. or less. The foregoing realizes contact resistance reduction of the interface between p-type SiC and the electrode.

The third semiconductor region 230 contains at least one element (hereinafter referred to as "element D") of N, P, and As. The portion in which the area density of the element D is maximized is provided in the interface part with the first electrode 240. The electrode 240 is ohmically connected to the third semiconductor region 230. The third semiconductor region 230 is a source region of the DiMOSFET.

In the third semiconductor region 230, in the case where the element D is P or As, if the element D is introduced in the C sites near the interface, localized states are produced near the top of the valence band. In the third semiconductor region 230, in the case where the element D is N, if the element D is introduced in Si sites near the interface, localized states are produced near the top of the valence band.

To realize this, in the case where the element D is P or As, the element D and Si are introduced (coimplanted) near the interface. In the case where the element D is N, the element D and C are introduced (coimplanted) near the interface. Furthermore, after the metal is connected, the element D located in the C sites or Si sites is diffused (annealing after metal connection). Coimplantation may be performed simultaneously for the element D and Si(C). Alternatively, one of them may be implanted first. In a basic pattern used in this embodiment, the element D is implanted, and only in its surface portion, Si(C) is implanted later.

This is because after the metal is connected to the third semiconductor region 230, electrons can migrate from the interface localized states to the metal side, and the entire system can be stabilized by the migration. This stabilization energy is a driving force for the pileup of the element D (N, P, As, etc.) to the interface.

Here, if the metal is not connected to the third semiconductor region 230, electrons cannot migrate. Thus, the element D cannot be collected to the surface. That is, the mere existence of the element D is insufficient. The element D needs to form localized states, and to be subjected to diffusion annealing after connection to the metal.

Because of the aforementioned stabilization energy due to electron migration, annealing for diffusing the element D is performed in a low temperature process at approximately 700° C. or less. The foregoing realizes contact resistance reduction of the interface between n-type SiC and the electrode.

In this embodiment, the element A is introduced by ion implantation into the fourth semiconductor region 220. Furthermore, in this embodiment, the element D is introduced by ion implantation into the third semiconductor region 230. In the coimplantation of the element A and Si, or the coimplantation of the element D and Si, the dopant fills the C sites to form localized states. As a result, a large amount of carbon defects are filled.

In the coimplantation of the element D and C, the introduced C fills carbon defects. Thus, a large amount of carbon defects can be filled. The carbon defect forms a localized state in the gap. This results in a large in-plane distribution of the contact resistance. This embodiment suppresses carbon defects and solves the problem of the in-plane distribution.

As described above, the "interface additive element" for each of the n-type SiC region and the p-type SiC region is contained so that the area density is maximized in the interface part with the electrode. This can realize resistance reduction with the electrode for each of n-type SiC and p-type SiC. Furthermore, an electrode (e.g., first electrode 240) made of the same metal material may be formed by e.g. the same manufacturing process on the n-type SiC region (e.g., third semiconductor region 230) and the p-type SiC region (e.g., fourth semiconductor region 220).

The first embodiment can realize a first resistance reduction (resistance reduction of the junction between the third semiconductor region 230 as an n-type SiC region and the first electrode 240 constituting a source electrode), a second resistance reduction (resistance reduction of the junction between the fourth semiconductor region 220 as a p-type SiC region and the first electrode 240 constituting a source electrode), and a third resistance reduction (resistance reduction of the junction between the substrate 200 as an n-type SiC region and the second electrode 262 constituting a drain electrode).

The first embodiment is not limited thereto. That is, the first embodiment may be configured to realize only one or two of the first resistance reduction, the second resistance reduction, and the third resistance reduction.

In the future, with the pattern miniaturization, contacts need to be formed from the same metal material on both the n-type SiC region and the p-type SiC region. In this case, in view of the restriction of pattern alignment accuracy and the simplification of the process, it is desirable to simultaneously form low resistance electrodes.

In other words, a technique for obtaining low resistance contacts on both the n-type SiC region and the p-type SiC region simply by forming one electrode is desirable. If such resistance reduction cannot be realized, the on-resistance is made higher in the n-type SiC region. On the other hand, in the p-type SiC region, a resistor and a capacitor are effectively formed. This decreases the switching speed. A high contact resistance to the p-type SIC region results in a large RC time constant at the time of device operation. This decreases the operation speed.

According to the first embodiment, contacts can be formed from the same metal material on both the n-type SiC region and the p-type SiC region. Furthermore, low resistance electrodes can be simultaneously formed. Thus, in the n-type SiC region, the on-resistance can be reduced. On the other hand, in the p-type SiC region, the switching speed can be increased.

The technique of this embodiment is based on a low temperature process in which the annealing temperature used in forming the contact is approximately 700° C. or less. As a result, the process can be performed without disturbing the interface between SiC and the insulating film. This low temperature process also significantly contributes to the characteristics improvement of the semiconductor device.

Next, a method for manufacturing the semiconductor device 110 is described.

Figure 3:
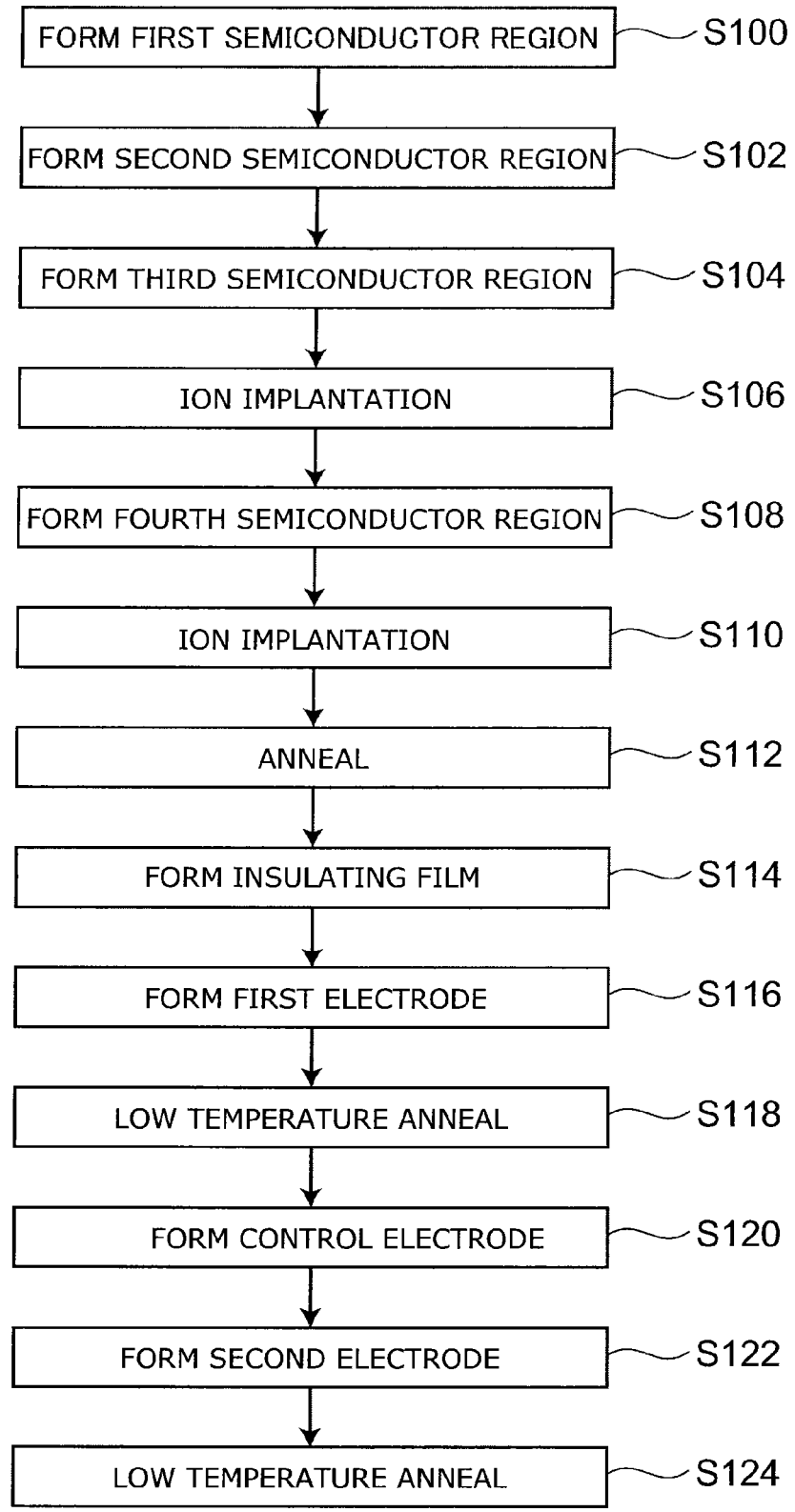
FIG. 3 is a flow chart illustrating the method for manufacturing a semiconductor device according to the first embodiment.

FIG. 3 is a flow chart illustrating the method for manufacturing a semiconductor device according to the first embodiment.

FIGS. 4A to 9 are schematic sectional views illustrating the method for manufacturing a semiconductor device according to the first embodiment.

As shown in FIG. 3, the method for manufacturing a semiconductor device includes forming a first semiconductor region (step S100), forming a second semiconductor region (step S102), forming a third semiconductor region (step S104), ion implantation (step S106), forming a fourth semiconductor region (step S108), ion implantation (step S110), annealing (step S112), forming an insulating film (step S114), forming a first electrode (step S116), low temperature annealing (step S118), forming a control electrode (step S120), forming a second electrode (step S122), and low temperature annealing (step S124).

Figure 4A:
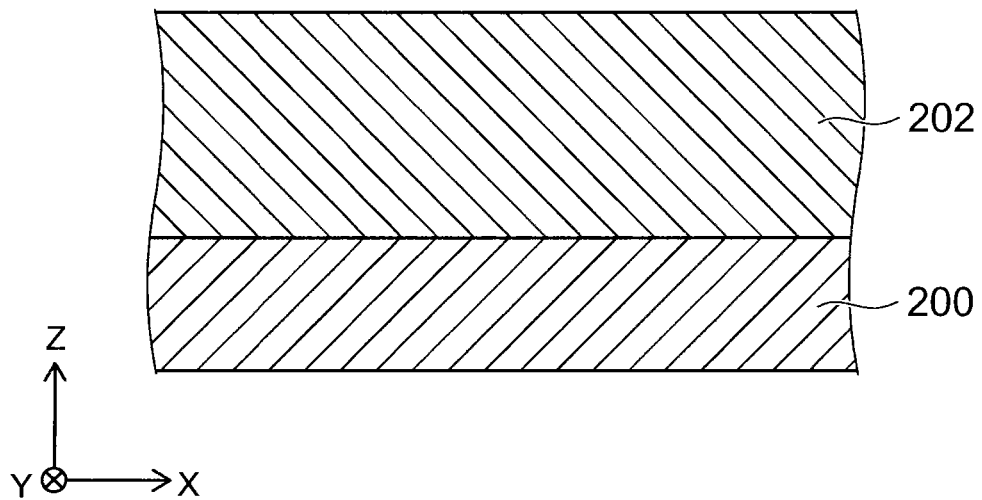
FIG. 4A to FIG. 9 are schematic sectional views illustrating the method for manufacturing a semiconductor device according to the first embodiment.

In forming a first semiconductor region of step S100, as shown in FIG. 4A, on the surface of a substrate 200 of $n^+$-SiC, a first semiconductor region 202 as an $n^-$-SiC semiconductor layer is formed.

As a substrate 200, for instance, a solid monocrystalline SiC substrate is used. The impurity concentration (doping concentration) in the substrate 200 is preferably $1 \times 10^{16}$ atoms/cm$^3$ or more and less than $1 \times 10^{20}$ atoms/cm$^3$. In this embodiment, the impurity concentration of the substrate 200 is e.g. $6 \times 10^{17}$ atoms/cm$^3$. Also in the following examples, unless otherwise specified, the substrate 200 having an impurity concentration of $6 \times 10^{17}$ atoms/cm$^3$ is used irrespective of p-type and n-type. The substrate 200 is preferably a hexagonal SiC substrate (4H—SiC substrate) of the (0001) surface. The first semiconductor region 202 is formed on the surface of the substrate 200 by epitaxial vapor phase growth technique.

In forming an epitaxial layer, as a raw material gas, for instance, SiH$_4$ gas and C$_3$H$_8$ gas are used. As an impurity (dopant), at least one of N, P, and As is used. The first semiconductor region 202 constitutes a breakdown voltage holding layer of the semiconductor device 110.

The film thickness of the first semiconductor region 202 is preferably e.g. 0.5 micrometers (μm) or more and 20 μm or less. In this embodiment, the film thickness of the first semiconductor region 202 is e.g. 10 μm.

The impurity concentration (doping concentration) of the first semiconductor region 202 is preferably $8 \times 10^{14}$ atoms/cm$^3$ or more and less than $3 \times 10^{17}$ atoms/cm$^3$. In this embodiment, the impurity concentration of the first semiconductor region 202 is e.g. $5 \times 10^{15}$ atoms/cm$^3$. Also in the following examples, unless otherwise specified, the first semiconductor region 202 having an impurity concentration of $5 \times 10^{15}$ atoms/cm$^3$ is used.

Figure 4B:
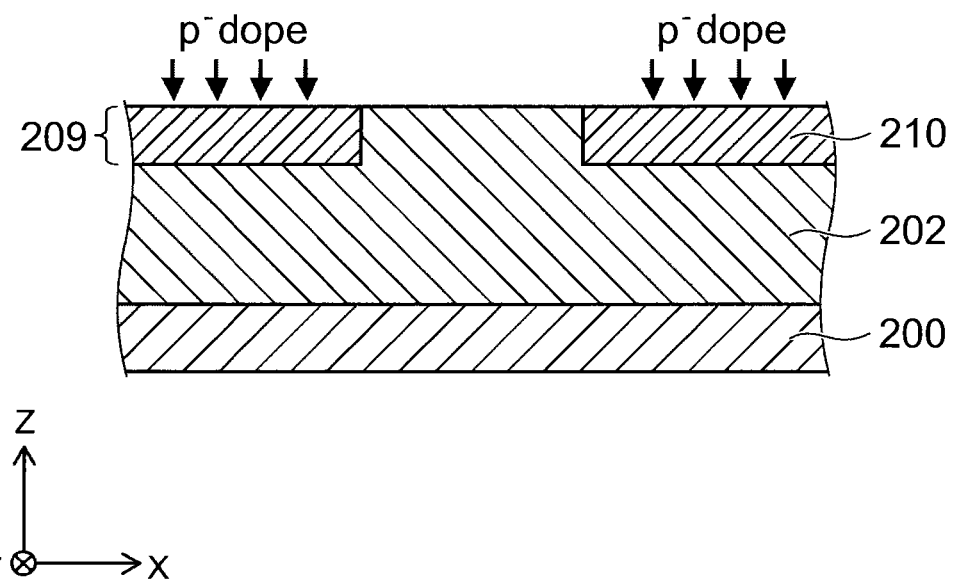

In forming a second semiconductor region of step S102, as shown in FIG. 4B, an oxide film (not shown) formed by photolithography and etching is used as a mask to selectively implant an impurity of p-type conductivity into the first semiconductor region 202. Thus, a second semiconductor region 210 as a $p^-$-SiC semiconductor region is formed.

The impurity concentration in the second semiconductor region 210 is e.g. $1 \times 10^{16}$/cm$^3$. Also in the following examples, unless otherwise specified, the second semiconductor region 210 having an impurity concentration of $1 \times 10^{16}$ atoms/cm$^3$ is used.

The implantation of Al ions as a p-type impurity is performed under the condition of e.g. a dose amount of $1 \times 10^{15}$/cm$^2$ and an energy of 80 keV. In this embodiment, ion implantation is performed by heating the substrate 200 to e.g. 300° C. The impurity concentration in the second semiconductor region 210 is preferably $1 \times 10^{13}$/cm$^3$ or more and $5 \times 10^{17}$/cm$^3$ or less. More preferably, the impurity concentration in the second semiconductor region 210 is $1 \times 10^{15}$/cm$^3$ or more and $5 \times 10^{16}$/cm$^3$ or less.

Figure 5A:
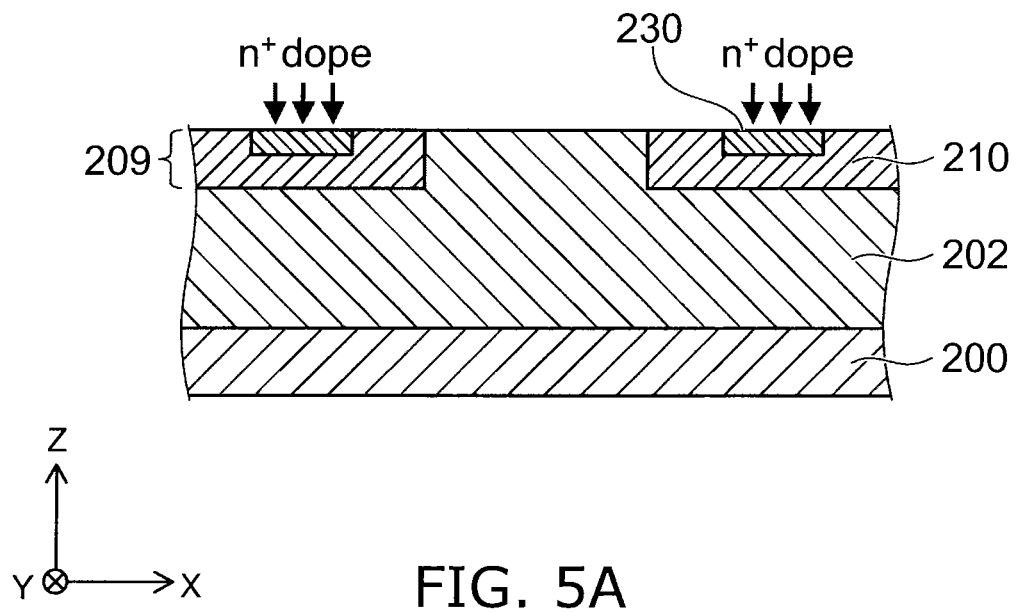

In forming a third semiconductor region of step S104, as shown in FIG. 5A, an oxide film (not shown) formed by photolithography and etching is used as a mask to selectively implant an n-type impurity into part of the surface of the second semiconductor region 210. Thus, a third semiconductor region 230 as an $n^+$-SiC semiconductor region is formed. As the impurity, at least one of N, P, and As is used.

The impurity concentration in the third semiconductor region 230 is e.g. $2 \times 10^{20}$ atoms/cm$^3$. The implantation of N ions as an n-type impurity is performed under the condition of e.g. a dose amount of $1 \times 10^{15}$ atoms/cm$^2$ and an energy of 40 keV. In the embodiment, ion implantation is performed by heating the substrate 200 to 300° C.

The impurity concentration in the third semiconductor region 230 is preferably $1 \times 10^{14}$ atoms/cm$^3$ or more and $5 \times 10^{20}$ atoms/cm$^3$ or less. More preferably, the impurity concentration in the third semiconductor region 230 is $5 \times 10^{15}$ atoms/cm$^3$ or more and $3 \times 10^{20}$ atoms/cm$^3$ or less.

Figure 5B:
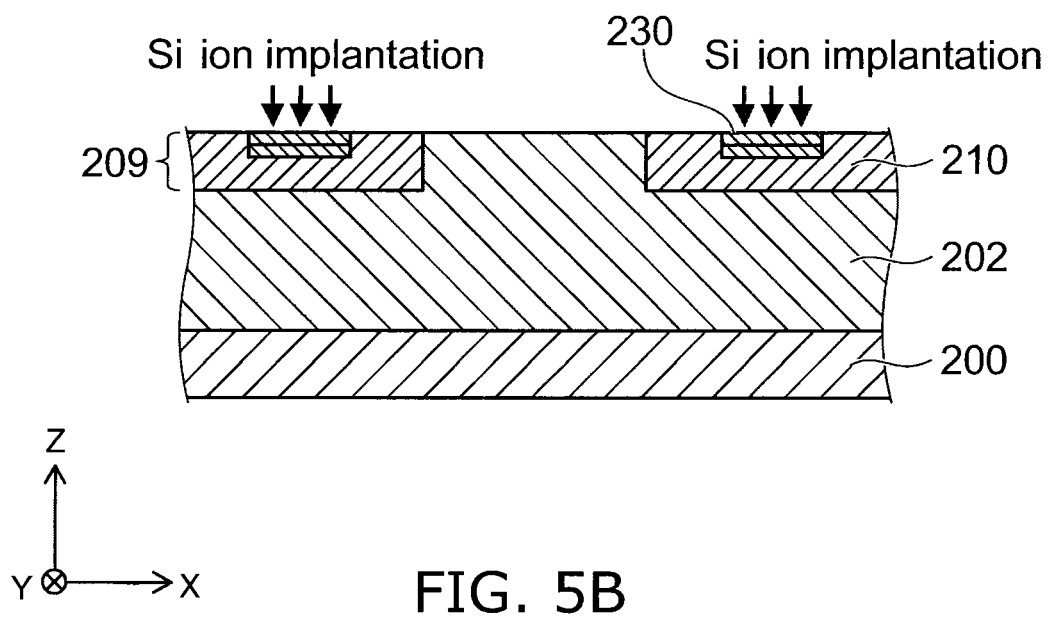

In ion implantation of step S106, as shown in FIG. 5B, Si or C ions are implanted near the surface of the third semiconductor region 230. In this ion implantation, the same mask as the mask used in forming the third semiconductor region 230 is used.

In the case where the impurity of the third semiconductor region 230 is N, C ions are implanted in this ion implantation. Thus, N of the third semiconductor region 230 is introduced into the Si sites of SiC to form localized states.

In the case where the impurity of the third semiconductor region 230 is at least one of P and As, Si ions are implanted in this ion implantation. Thus, P or As of the third semiconductor region 230 is introduced into the C sites of SiC to form localized states.

Figure 6A:
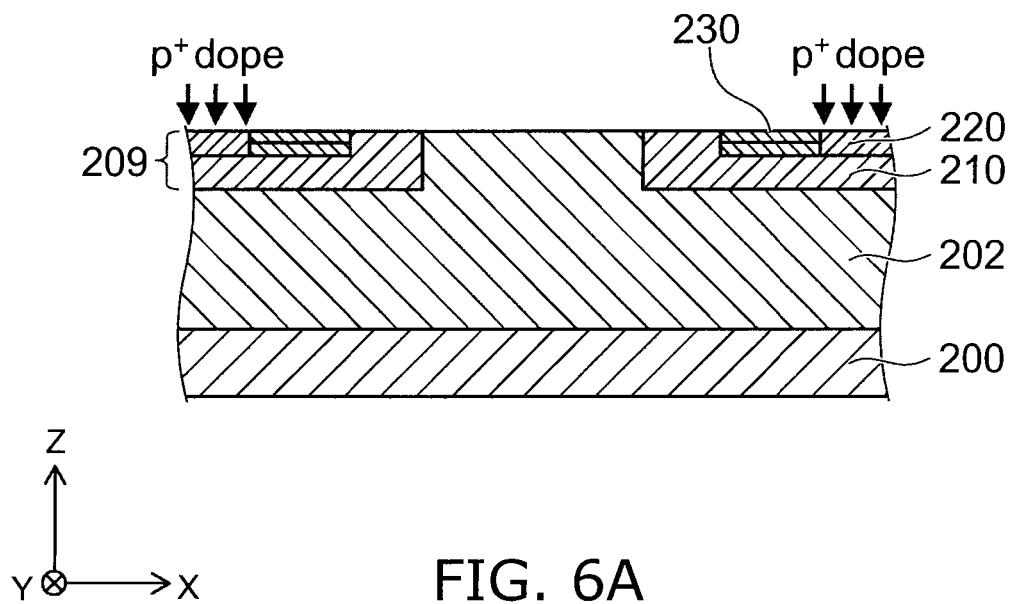

In forming a fourth semiconductor region of step S108, as shown in FIG. 6A, an oxide film (not shown) formed by photolithography and etching is used as a mask to selectively implant a p-type impurity into part of the surface of the second semiconductor region 210. The p-type impurity is implanted into the position adjacent to the third semiconductor region 230. Thus, a fourth semiconductor region 220 as a $p^+$-SiC semiconductor region is formed. As the impurity, at least one of B, Al, and Ga is used.

The impurity concentration in the fourth semiconductor region 220 is e.g. $2 \times 10^{20}$ atoms/cm$^3$. The implantation of Al ions as a p-type impurity is performed under the condition of e.g. a dose amount of $1 \times 10^{15}$ atoms/cm$^2$ and an energy of 40 key. In the embodiment, ion implantation is performed by heating the substrate 200 to 300° C.

The impurity concentration in the fourth semiconductor region 220 is preferably $1 \times 10^{14}$ atoms/cm$^3$ or more and $5 \times 10^{20}$ atoms/cm$^3$ or less. More preferably, the impurity concentration in the fourth semiconductor region 220 is $5 \times 10^{15}$ atoms/cm$^3$ or more and $3 \times 10^{20}$ atoms/cm$^3$ or less.

Figure 6B:
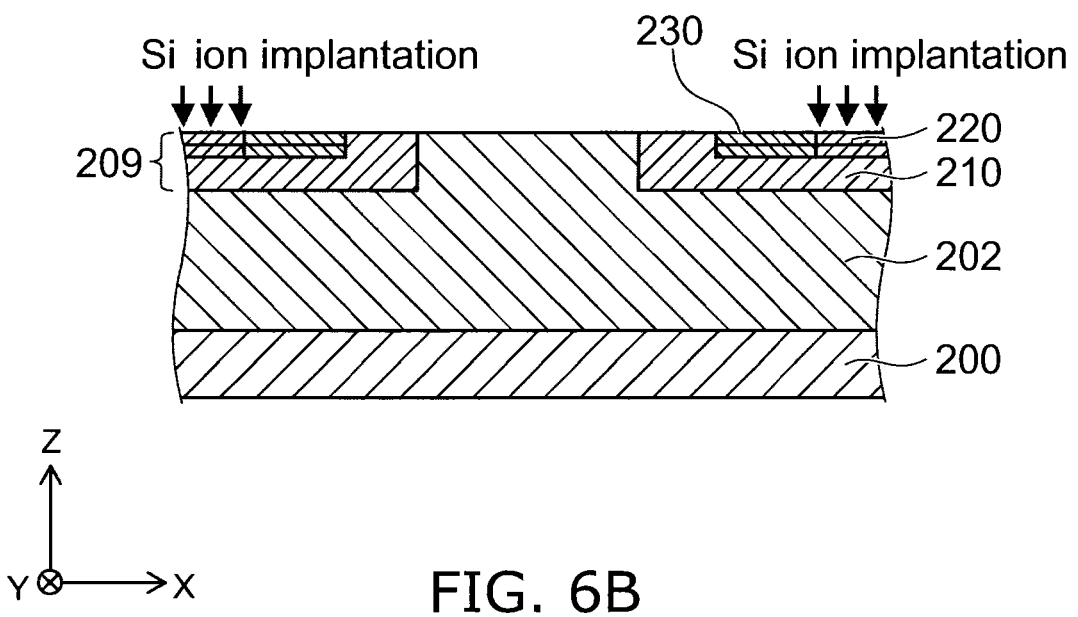

In ion implantation of step S110, as shown in FIG. 6B, Si ions are implanted near the surface of the fourth semiconductor region 220. In this ion implantation, the same mask as the mask used in forming the fourth semiconductor region 220 is used. By this ion implantation, the impurity (at least one of B, Al, and Ga) of the fourth semiconductor region 220 is introduced into the C sites of SiC to form localized states.

In annealing of step S112, after the aforementioned ion implantation step, annealing treatment for activation is performed. In this activation annealing treatment, for instance, argon (Ar) gas is used as an atmosphere gas under the condition of a heating temperature of 1600° C. and a heating time of 30 minutes. This can realize activation of dopants introduced inside SiC, but scarcely diffuses the dopants.

Figure 7:
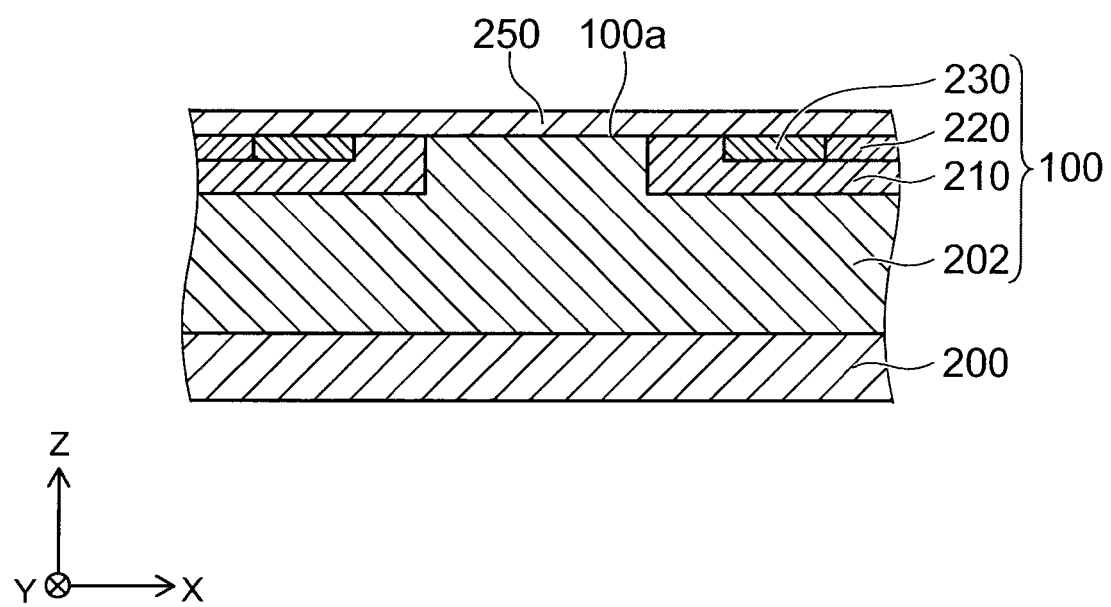

In forming an insulating film of step S114, as shown in FIG. 7, an insulating film 250 is formed so as to entirely cover the first semiconductor region 202, the second semiconductor region 210, the third semiconductor region 230, and the fourth semiconductor region 220.

As a method for forming the insulating film 250, for instance, dry oxidation (thermal oxidation) may be performed. For instance, a dense insulating film 250 is formed by dry oxidation under the condition of 1200° C. and a heating time of 30 minutes. Alternatively, by CVD and the like, a $SiO_2$ film may be formed as the insulating film 250.

Figure 8A:
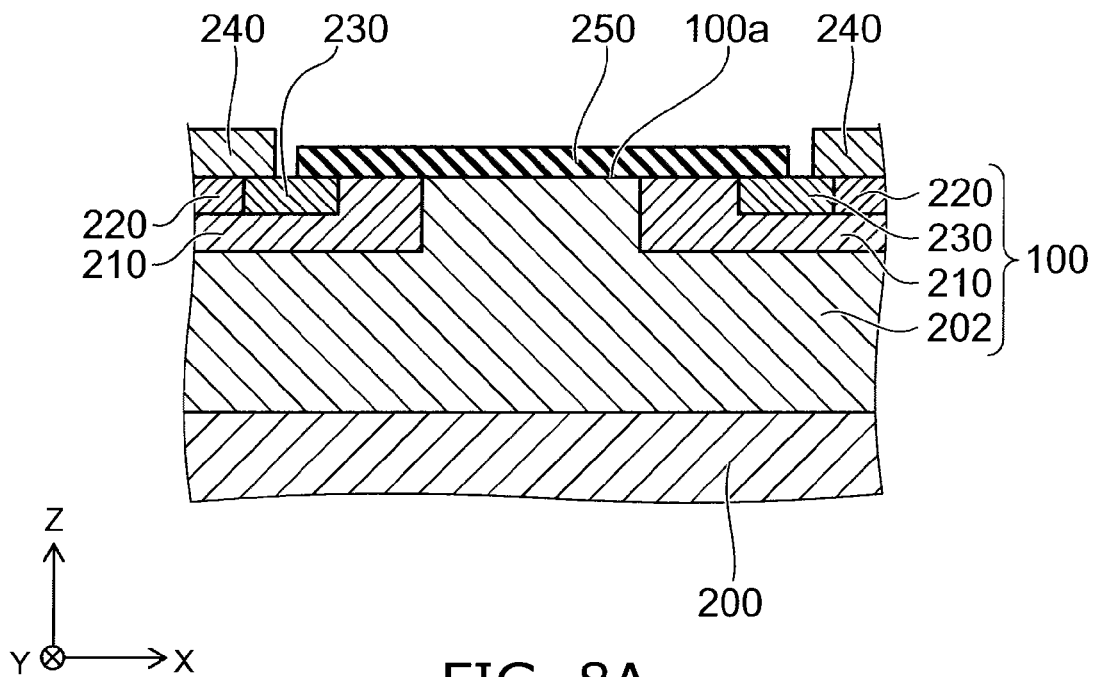

Next, as shown in FIG. 8A, a patterned resist film (not shown) is formed by using photolithography technique on the insulating film 250. Then, by using this resist film as a mask, the portion of the insulating film 250 located on the surface of the fourth semiconductor region 220 and part of the surface of the third semiconductor region 230 is removed by etching. Thus, an insulating film 250 astride the third semiconductor regions 230 on both sides is formed.

In forming a first electrode of step S116, as shown in FIG. 8A, a conductive film made of e.g. metal is formed on the surface of the fourth semiconductor region 220 and part of the surface of the third semiconductor region 230 exposed from the opening formed by the removal of the portion of the insulating film 250. This conductive film constitutes a first electrode 240. Then, the resist film is removed. Thus, the conductive film located on this resist film is removed (lift off). If the width of the insulating film 250 is narrowed by etch-back and the like, a gap is formed so that the insulating film 250 and the first electrode 240 are not in contact with each other.

Here, the conductor constituting the first electrode 240 is preferably e.g. nickel (Ni) or titanium nitride (TiN). By the subsequent low temperature annealing treatment, the effective work function of the first electrode 240 is pinned to approximately 4.2 eV in the $n^+$-region, and approximately 7.2 eV in the $p^+$-region. Thus, the material of the first electrode 240 is not particularly limited as long as being a stable conductor. Accordingly, for instance, other metals, or materials having good processability other than metals, such as tungsten (W), n-type polysilicon, and n-type poly-SiC, may be used.

In low temperature annealing of step S118, after the first electrode 240 is formed, heat treatment at e.g. 400° C. is performed. For instance, the heat treatment is performed in Ar gas with a heating time of 5 minutes. By such heat treatment, N (or P, As) is collected (piled up) at the interface between the first electrode 240 and the third semiconductor region 230 as an $n^+$-SiC semiconductor region, and Al (or B, Ga) is collected (piled up) at the interface between the first electrode 240 and the fourth semiconductor region 220 as a $p^+$-SiC semiconductor region. This is because the state of N and Al is stabilized by pileup at the interface through the exchange of electrons with the electrode. In low temperature annealing at 400° C. or less, diffusion is less likely to occur. Thus, low temperature annealing at 400° C. or more is desirable. On the other hand, low temperature annealing above 700° C. is likely to affect the interface with the insulating film. That is, the temperature of low temperature annealing is preferably 400° C. or more and 700° C. or less. Lower temperature is more manageable. Thus, in this embodiment, 400° C. is used as a standard.

Here, after the insulating film 250 constituting a gate insulating film is formed, annealing at high temperature (e.g., 1600° C. or 950° C.) is likely to cause degradation of the interface between the insulating film 250 and the channel region. In this embodiment, such degradation is suppressed because the heating temperature can be significantly decreased to 400° C. If the temperature of the low temperature annealing of step S118 is set to 700° C. or less, the interface degradation is suppressed.

Figure 8B:
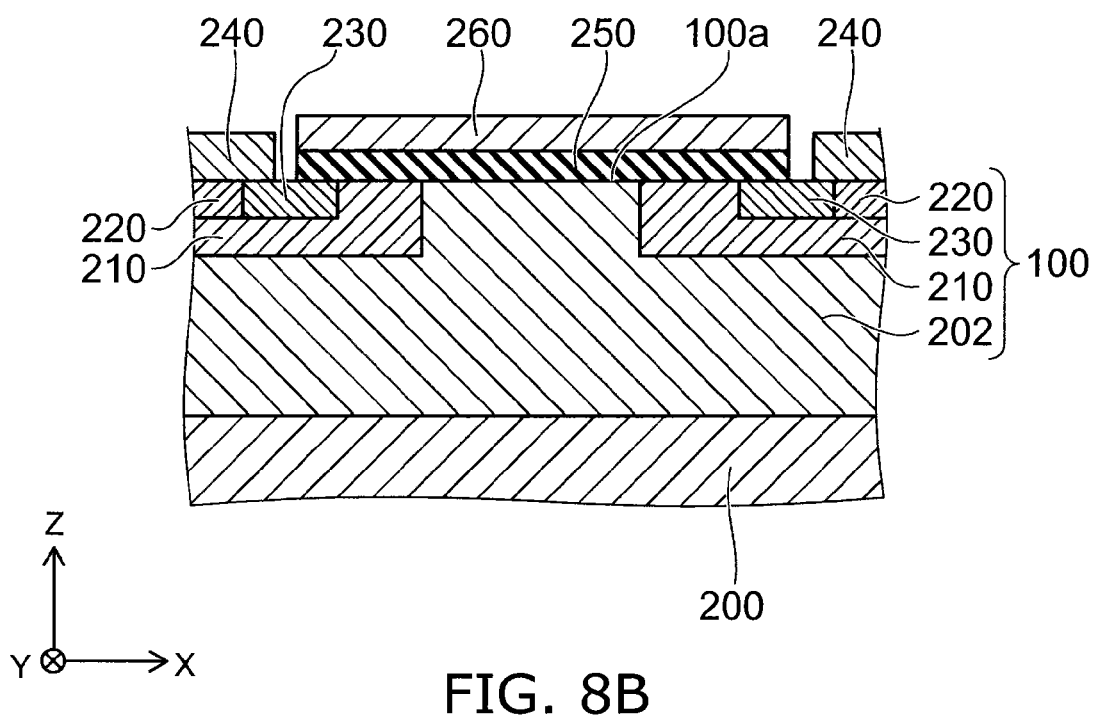

In forming a control electrode of step S120, as shown in FIG. 8B, on the insulating film 250 as a gate insulating film, a control electrode 260 is formed. The control electrode 260 is made of e.g. n-type polysilicon. Here, the first electrode may also be formed from n-type polysilicon so that both the first electrode 240 and the control electrode 260 are made of n-type polysilicon. Alternatively, a Ni film may be formed and heat treated so that the control electrode 260 is made of a NiSi salicide film.

Figure 9:
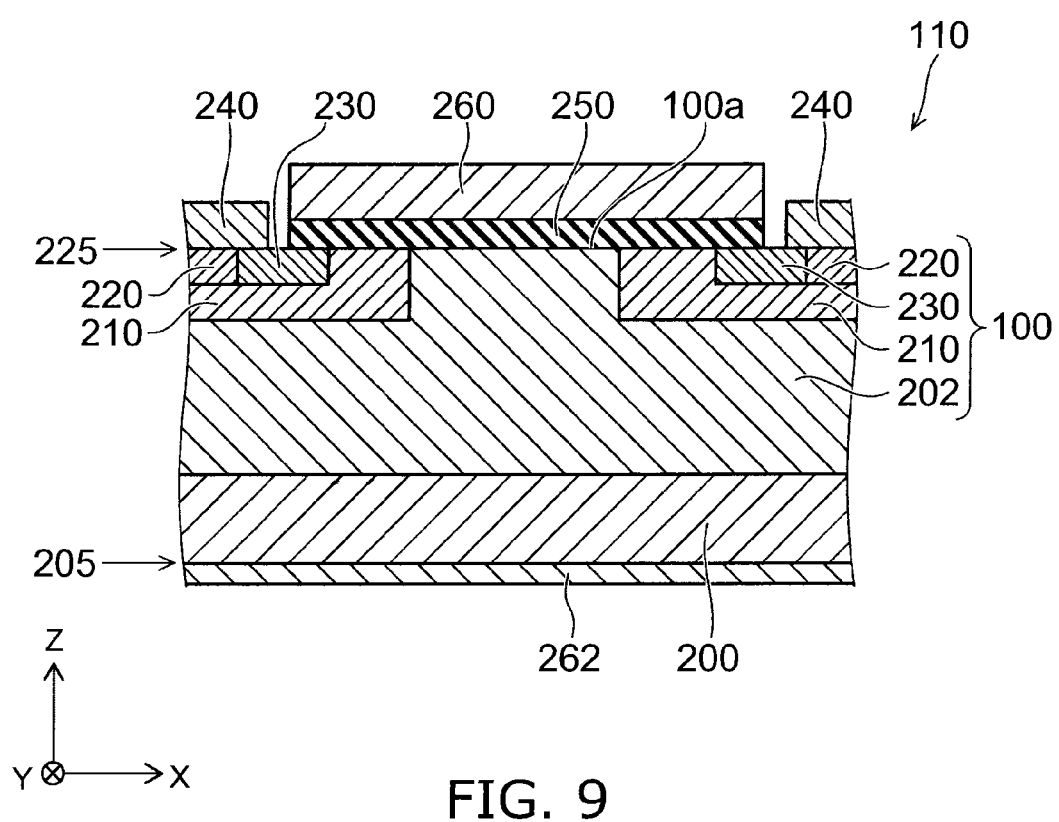

In forming a second electrode of step S122, as shown in FIG. 9, a second electrode 262 is formed on the back surface of the substrate 200. In forming the second electrode 262, Si (or C) ions may be previously implanted into the back surface of the substrate 200. In this case, after forming the second electrode 262, low temperature annealing is performed. In this embodiment, in the case where the dopant is P or As, Si is coimplanted near the surface. In the case where the dopant is N, C is coimplanted near the surface.

In the step of forming the second electrode 262, before forming the second electrode 262, the oxide film formed on the back surface of the substrate 200 in forming the insulating film 250 is removed. If the material of the second electrode 262 is e.g. Ni, a high temperature process above 800° C. is required.

As described earlier, C (or Si) ions are implanted into the back surface of the substrate 200, and low temperature annealing is performed after electrode formation. Thus, N (or P or As) as a material pinned to the interface is piled up. If this method is applied, the high temperature process can be avoided.

In low temperature annealing of step S124, heat treatment at e.g. 400° C. is performed. The low temperature annealing is performed in e.g. Ar gas with a heating time of 5 minutes. By such heat treatment, nitrogen is collected (piled up) at the interface between the electrode 262 and the substrate 200. At this time, NiSi is thinly formed near the interface. However, N is piled up at the interface with SiC, and the effective work function becomes 4.2 eV. Thus, the second electrode 262 is ohmically connected to the substrate 200.

Figure 10A:
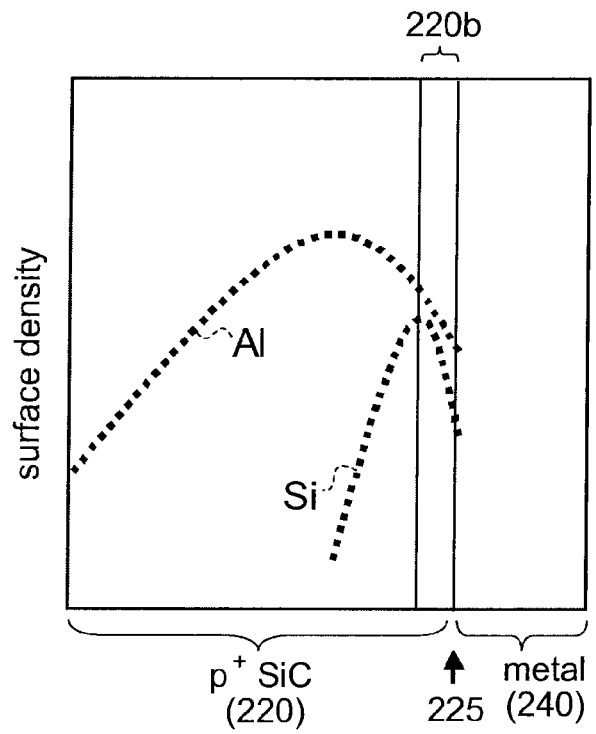
FIG. 10A and FIG. 10B illustrate the surface density of elements.
Figure 10B:
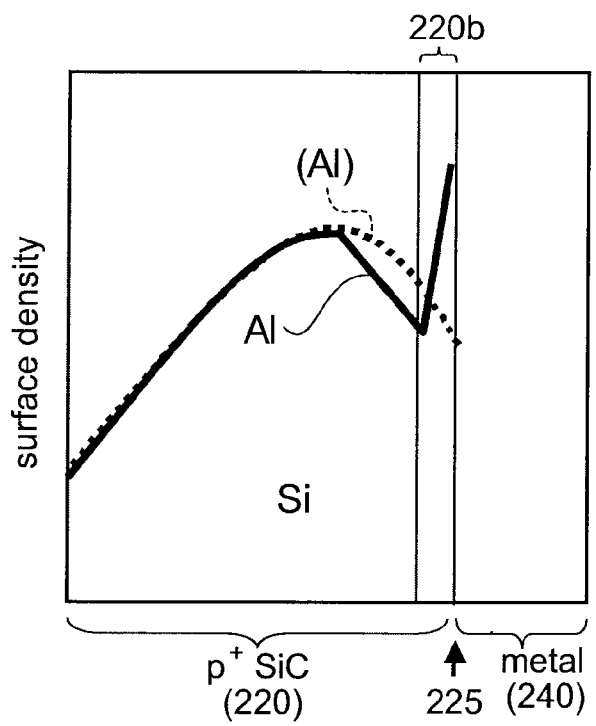

FIGS. 10A and 10B illustrate the area density of elements.

In FIGS. 10A and 10B, the vertical axis represents the area density of elements, and the horizontal axis represents position in the depth direction. FIG. 10A shows the distribution of the area density of Al and Si implanted by ion implantation before low temperature annealing. As shown in FIG. 10A, Si is introduced near the interface 225 between $p^+$-SiC (fourth semiconductor region 220) and the metal (first electrode 240). Because Si is implanted into SiC, the distribution of Si itself has a large value. However, the distribution of only the implanted Si is as shown in FIG. 10A. As shown, the implanted Si (or C) is characterized in being located only in the surface portion.

FIG. 10B shows the distribution of the area density of Al after low temperature annealing after forming the metal electrode. By low temperature annealing, Al is collected (piled up) in the interface portion 220b of $p^+$-SiC with the metal. The portion in which the area density of Al is maximized is formed in the range (interface portion 220b) from the interface 225 between $p^+$-SiC and the metal to a depth of 1 nm into $p^+$-SiC. In the depth direction of $p^+$-SiC, the distribution of the area density of Al may have a peak (maximum portion) other than its maximum. This is because a peak of the distribution before low temperature annealing and a maximum of the distribution after low temperature annealing (maximum of the interface portion 220b) are formed. The subsequently implanted Si (or C) leads dopants to localized states by low temperature annealing after electrode formation. It is desired to form localized states only in the interface portion with the electrode without forming localized states inside Si (or C). Thus, Si (or C) is introduced only in the surface portion.

In the semiconductor device 110 according to this embodiment, according to precise measurements of Al (in the case where the element implanted into the interface is Al) and P (in the case where the element implanted into the interface is P) at the interface between the SiC region and the electrode, it is found that the implanted element is distributed with a peak within approximately 1 nm. The area density of the interfacial Al is approximately $1.5 \times 10^{14}/cm^2$, and the area density of the interfacial P is approximately $0.8 \times 10^{14}/cm^2$. This also applies similarly to elements other than Al, such as B and Ga. This also applies similarly to elements other than P, such as As and N. However, in the case of N, C is coimplanted instead of Si described above. The result is that by using any of the dopants, a low resistance contact structure free from in-plane distribution (i.e., with few carbon defects near the interface) is similarly obtained.

Here, with regard to the orientation of the surface of the substrate 200 on which the first semiconductor region 202 is formed, a 4H—SiC substrate with other major surfaces such as the (000-1) surface may be used. This is because ohmic connection due to pileup of the element at the interface between the first electrode 240 on one hand and the $n^+$-region and the $p^+$-region on the other as in the embodiment is effective irrespective of the substrate orientation. The orientation of the surface of the substrate 200 on which the first semiconductor region 202 is formed may also be e.g. the (11-20) surface.

As described above in detail, the first embodiment obtains ohmic connection due to pileup of the element at the interface between the first electrode 240 on one hand and the $n^+$-region (third semiconductor region 230) and the $p^+$-region (fourth semiconductor region 220) on the other. As a result, the following effects (1)-(4) are achieved.

(1) The on-resistance at the interface between the first electrode 240 and the $n^+$-region (third semiconductor region 230) can be reduced. A contact resistance of $1 \times 10^{-7}$ $\Omega cm^2$ is achieved.

(2) The on-resistance at the interface between the first electrode 240 and the $p^+$-region (fourth semiconductor region 220) can be reduced. A contact resistance of $1 \times 10^{-6}$ $\Omega cm^2$ is achieved.

(3) In this embodiment, low temperature annealing is performed for the purpose of pileup of the additive substance. As a result, the channel mobility has a value larger by approximately one order of magnitude (a peak value of 200 $cm^2/Vs$ after the process of this embodiment) than conventional (a peak value of 20 $cm^2/Vs$ after the high temperature heat process). This improvement in mobility directly affects the on-resistance, and hence is very effective in the improvement of device characteristics.

(4) No significant difference was observed even when the material of the first electrode 240 was TiN, polysilicon, and W. That is, in this embodiment, the dependence on the electrode material is low.

As described above, according to the first embodiment, a low resistance contact between the p-type SiC region and the metal, and a low resistance contact between the n-type SiC region and the metal, are realized at low temperature. Furthermore, one electrode can be connected simultaneously to the p-type SiC region and the n-type SiC region. That is, the first electrode 240 can be ohmically connected to the p-type SiC region and the n-type SiC region adjacent to each other. Furthermore, the second electrode 262 can be ohmically connected to the n-type SiC region on the back surface of the substrate 200.

According to the first embodiment, Si (or C only in the case where the dopant is N) ions are made coexistent with the dopant in the SiC region. Thus, many C defects generated near the interface between SiC and the electrode are filled with the dopant (or C only in the case where the dopant is N). As shown earlier, if the process of this embodiment is not applied, the amount of generated C defects is $2.2 \times 10^{16}/cm^3$ or more.

However, if the process of this embodiment is introduced, the amount of C defects is approximately $1.0 \times 10^{13}/cm^3$, exhibiting reduction by approximately three orders of magnitude. As a result, the in-plane distribution of the contact resistance is made negligible. In a device in which units of vertical MOSFETs are arranged in parallel, if the resistance is varied between the units, the current may flow in part of the device and cause breakdown. According to this embodiment, this point is also significantly improved.

Second Embodiment

Figure 11:
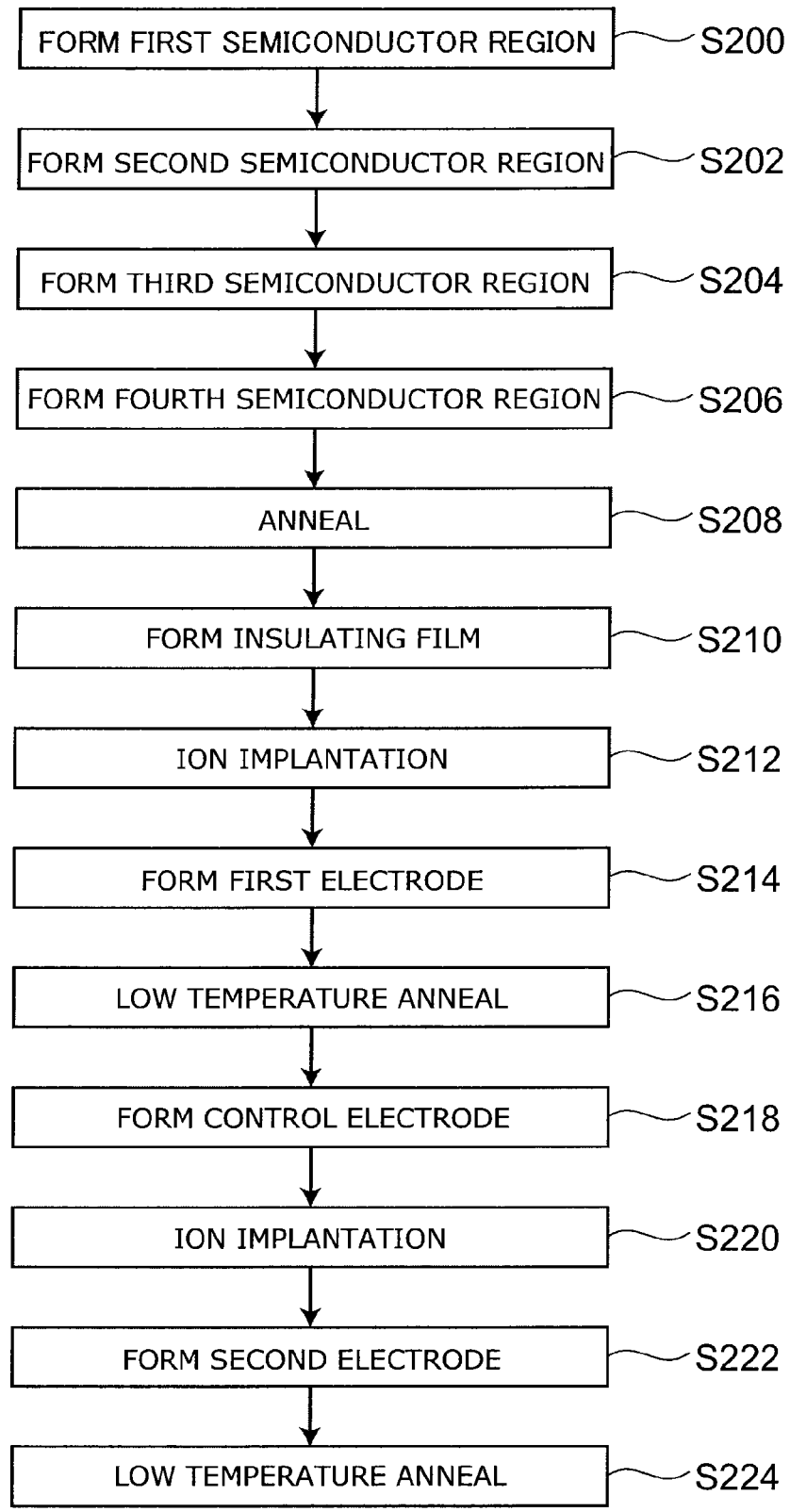
FIG. 11 is a flow chart illustrating a method for manufacturing a semiconductor device according to a second embodiment.

FIG. 11 is a flow chart illustrating a method for manufacturing a semiconductor device according to a second embodiment.

As shown in FIG. 11, the method for manufacturing a semiconductor device includes forming a first semiconductor region (step S200), forming a second semiconductor region (step S202), forming a third semiconductor region (step S204), forming a fourth semiconductor region (step S206), annealing (step S208), forming an insulating film (step S210), ion implantation (step S212), forming a first electrode (step S214), low temperature annealing (step S216), forming a control electrode (step S218), ion implantation (step S220), forming a second electrode (step S222), and low temperature annealing (step S224).

In the method for manufacturing a semiconductor device according to the second embodiment, the number of times of ion implantation is smaller than in the manufacturing method shown in FIG. 3. In the method for manufacturing a semiconductor device according to the second embodiment shown in FIG. 11, ion implantation of Si is not performed after forming a third semiconductor region shown in step S204, and after forming a fourth semiconductor region shown in step S206. Ion implantation of Si is performed in step S212 after annealing of step S208 and forming an insulating film of step S210.

FIGS. 12A to 14 are schematic sectional views illustrating the method for manufacturing a semiconductor device according to the second embodiment.

Figure 12A:
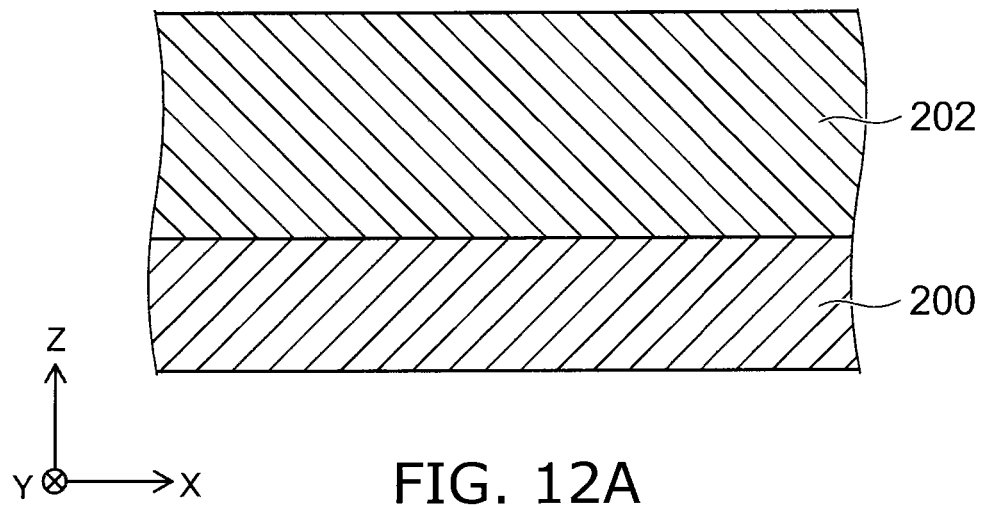
FIG. 12A to FIG. 14 are schematic sectional views illustrating the method for manufacturing a semiconductor device according to the second embodiment.

In forming a first semiconductor region of step S200, as shown in FIG. 12A, on the surface of a substrate 200 of $n^+$-SiC, a first semiconductor region 202 as an $n^-$-SiC semiconductor layer is formed.

Figure 12B:
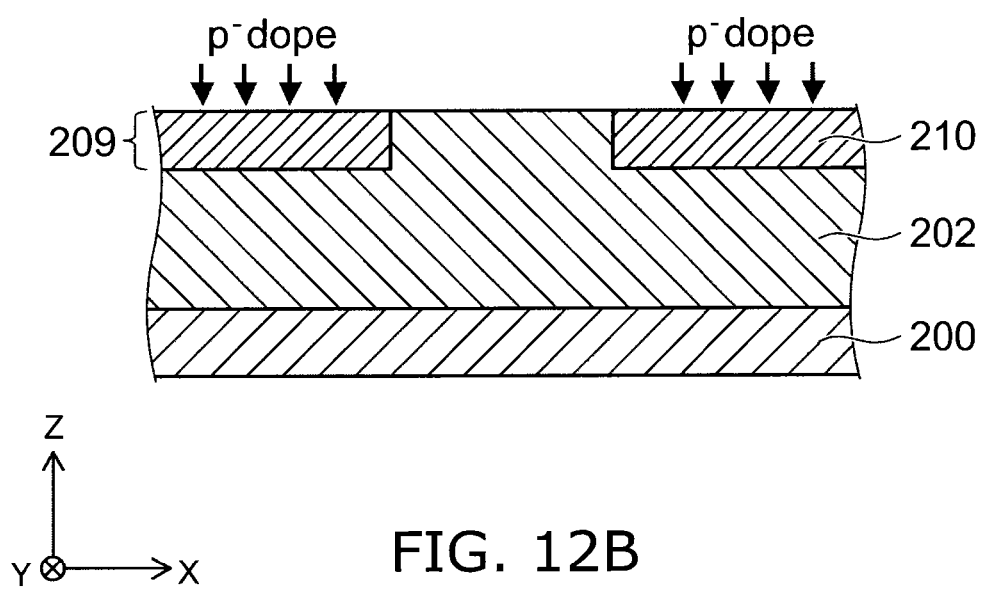

In forming a second semiconductor region of step S202, as shown in FIG. 12B, an oxide film (not shown) formed by photolithography and etching is used as a mask to selectively implant an impurity of p-type conductivity into the first semiconductor region 202. Thus, a second semiconductor region 210 as a $p^-$-SiC semiconductor region is formed.

Figure 13A:
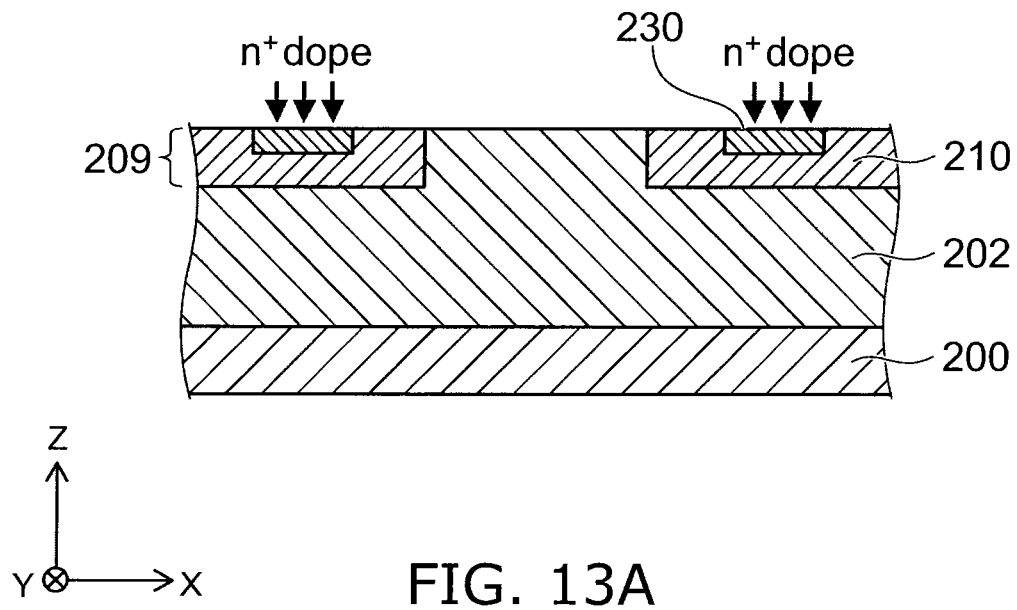

In forming a third semiconductor region of step S204, as shown in FIG. 13A, an oxide film (not shown) formed by photolithography and etching is used as a mask to selectively implant an n-type impurity into part of the surface of the second semiconductor region 210. Thus, a third semiconductor region 230 as an $n^+$-SiC semiconductor region is formed. In this embodiment, as the impurity, at least one of P and As is used. In this embodiment, Si is made coexistent, and hence N is not suitable.

Figure 13B:
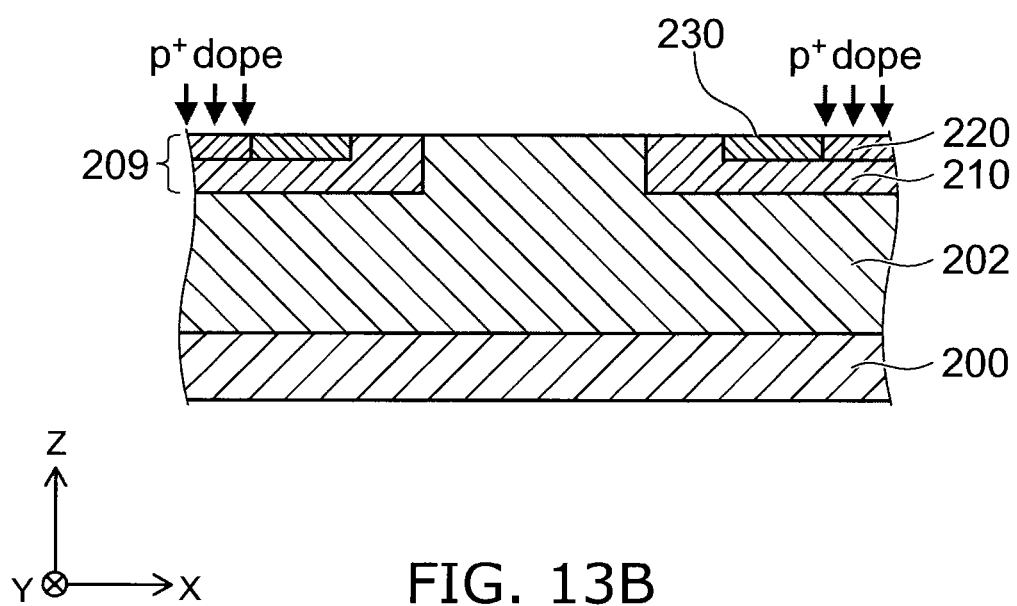

In forming a fourth semiconductor region of step S206, as shown in FIG. 13B, an oxide film (not shown) formed by photolithography and etching is used as a mask to selectively implant a p-type impurity into part of the surface of the second semiconductor region 210. The p-type impurity is implanted into the position adjacent to the third semiconductor region 230. Thus, a fourth semiconductor region 220 as a p$^+$-SiC semiconductor region is formed. As the impurity, at least one of B, Al, and Ga is used.

Then, in annealing of step S208, after the aforementioned ion implantation step, annealing treatment for activation is performed.

Figure 14:
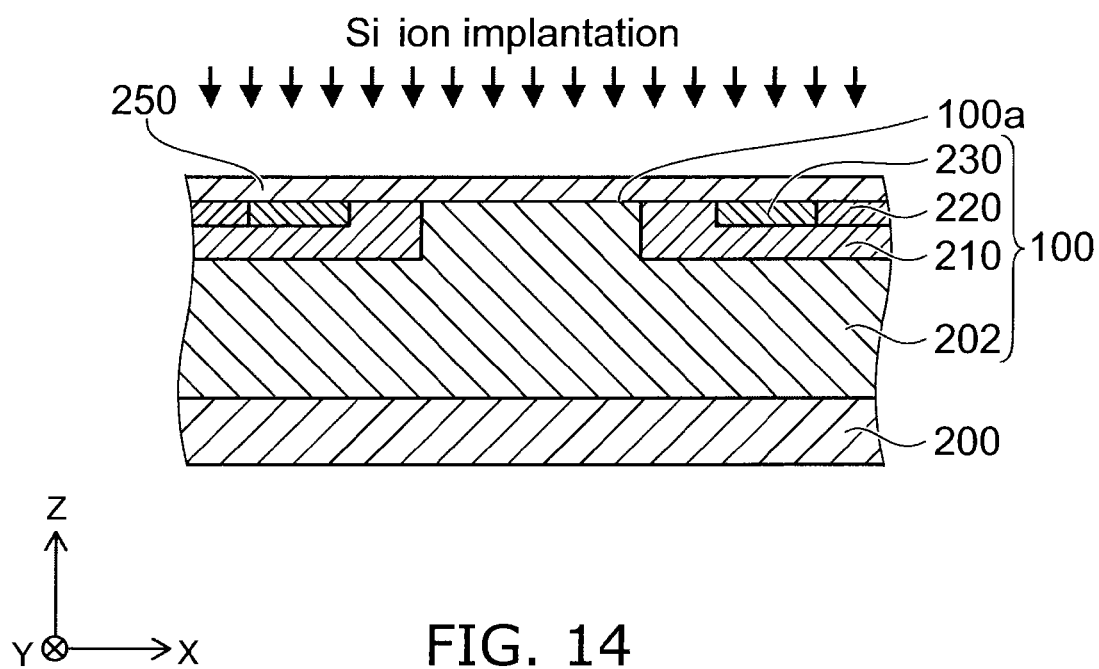

In forming an insulating film of step S210, as shown in FIG. 14, an insulating film 250 is formed so as to entirely cover the first semiconductor region 202, the second semiconductor region 210, the third semiconductor region 230, and the fourth semiconductor region 220. As a method for forming the insulating film 250, for instance, dry oxidation (thermal oxidation) may be performed. For instance, a dense insulating film 250 is formed by dry oxidation under the condition of 1200° C. and a heating time of 30 minutes. Alternatively, by CVD and the like, a SiO$_2$ film may be formed as the insulating film 250.

In ion implantation of step S212, as shown in FIG. 14, Si ions are implanted into the third semiconductor region 230 and the fourth semiconductor region 220 from above the insulating film 250. By this ion implantation, the impurity of the third semiconductor region 230 and the impurity of the fourth semiconductor region 220 are introduced into the C sites of SiC to form localized states.

The process after forming the insulating film 250 is similar to that of the manufacturing method shown in FIG. 3. In the method for manufacturing a semiconductor device according to the second embodiment, ion implantation of Si into the third semiconductor region 230 and the fourth semiconductor region 220 can be completed by one step. This can shorten the manufacturing process.

In ion implantation shown in step S212, ion implantation of Si into the back surface of the substrate 200 may also be performed. This can further shorten the manufacturing process.

Third Embodiment

Figure 15:
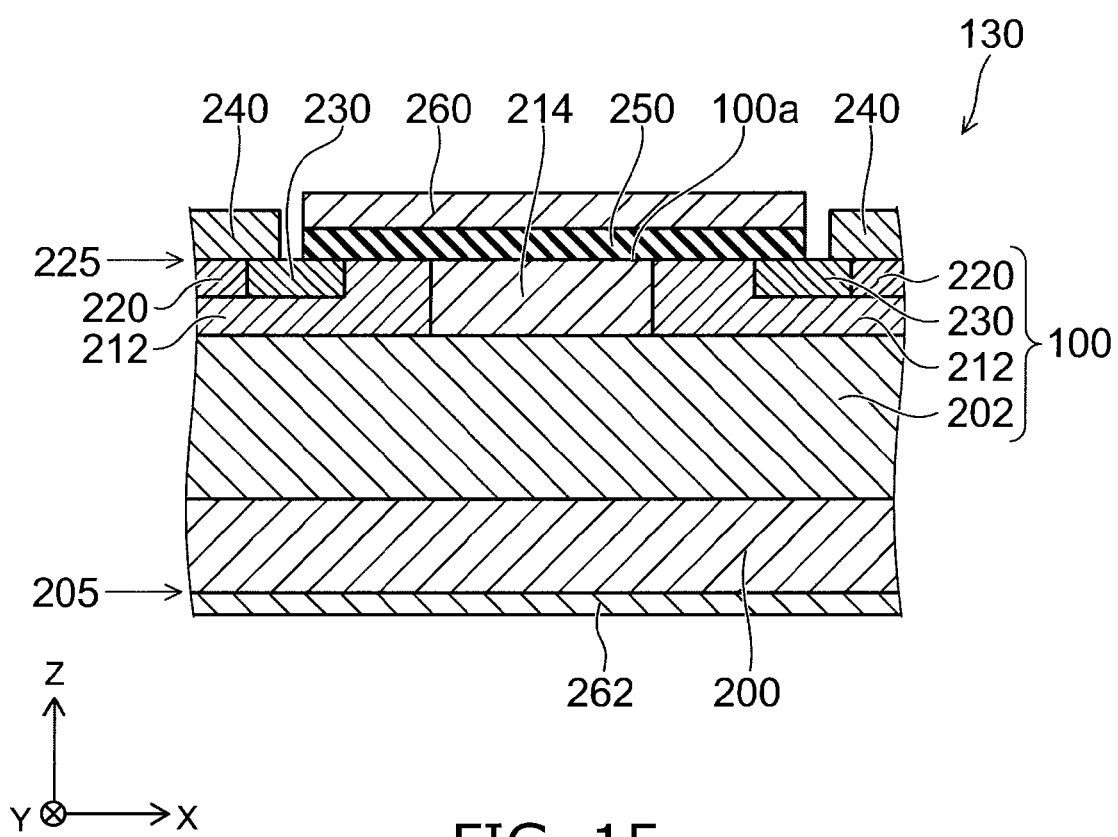
FIG. 15 is a schematic sectional view illustrating a semiconductor device according to a third embodiment.

FIG. 15 is a schematic sectional view illustrating a semiconductor device according to a third embodiment.

As shown in FIG. 15, the semiconductor device 130 according to the third embodiment is different from the semiconductor device 110 according to the first embodiment in that a fifth semiconductor region 214 is provided on the first semiconductor region 202, and that a second semiconductor region 212 is formed by epitaxial growth.

The fifth semiconductor region 214 is formed between a plurality of second semiconductor regions 212 spaced from each other. The fifth semiconductor region 214 is an n-type (n$^+$) SiC semiconductor region.

Figure 16:
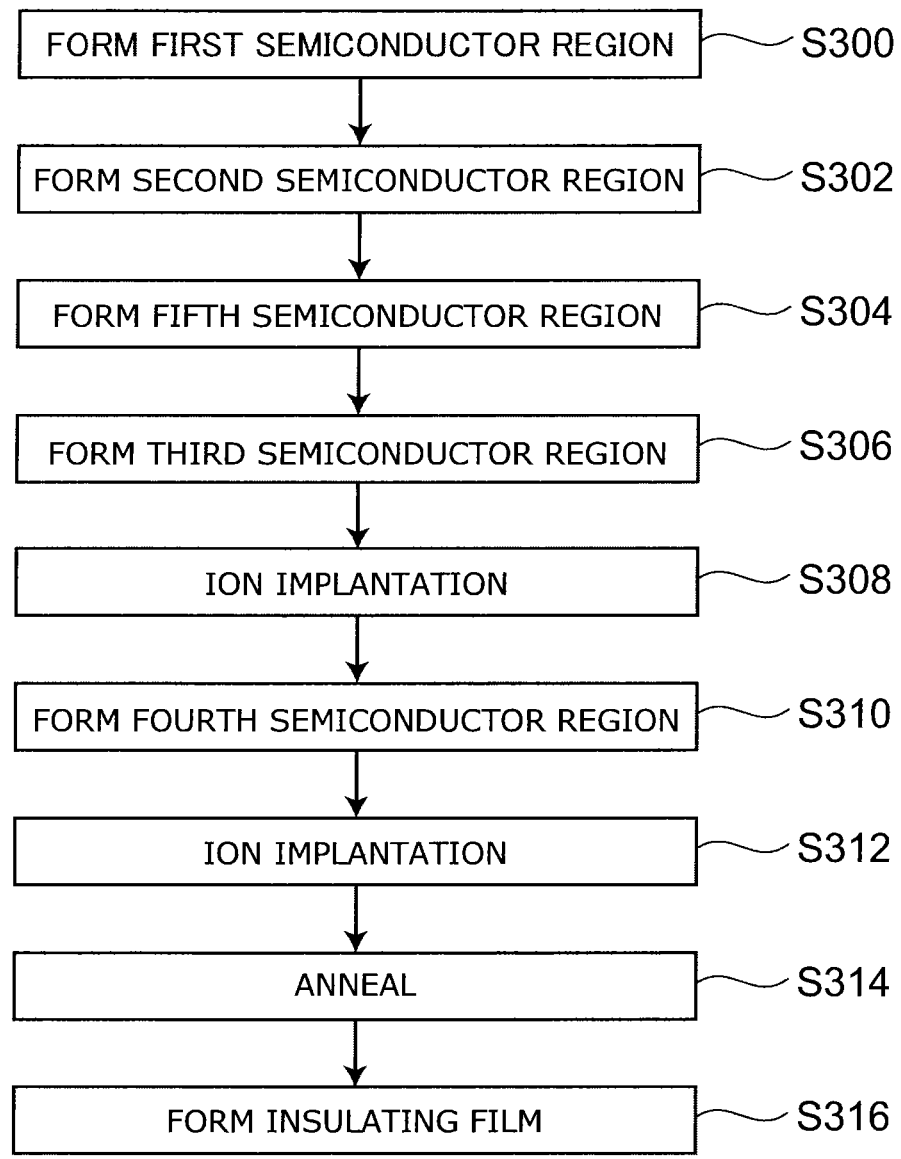
FIG. 16 is a flow chart illustrating a method for manufacturing a semiconductor device according to the third embodiment.

FIG. 16 is a flow chart illustrating a method for manufacturing a semiconductor device according to the third embodiment.

As shown in FIG. 16, the method for manufacturing a semiconductor device according to the third embodiment includes forming a first semiconductor region (step S300), forming a second semiconductor region (step S302), forming a fifth semiconductor region (step S304), forming a third semiconductor region (step S306), ion implantation (step S308), forming a fourth semiconductor region (step S310), ion implantation (step S312), annealing (step S314), and forming an insulating film (step S316). The process after forming an insulating film is similar to that of the method for manufacturing the semiconductor device 110 according to the first embodiment shown in FIG. 3.

Figure 17A:
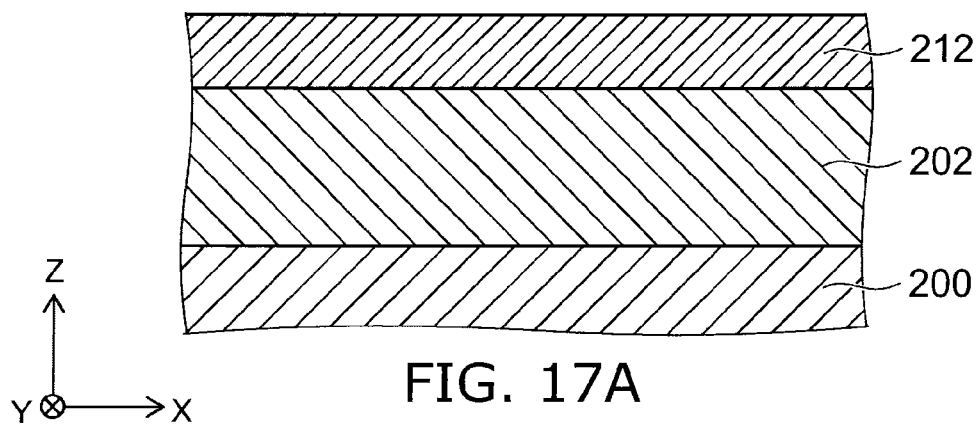
FIG. 17A to FIG. 17C are schematic sectional views illustrating the method for manufacturing a semiconductor device according to the third embodiment.
Figure 17B:
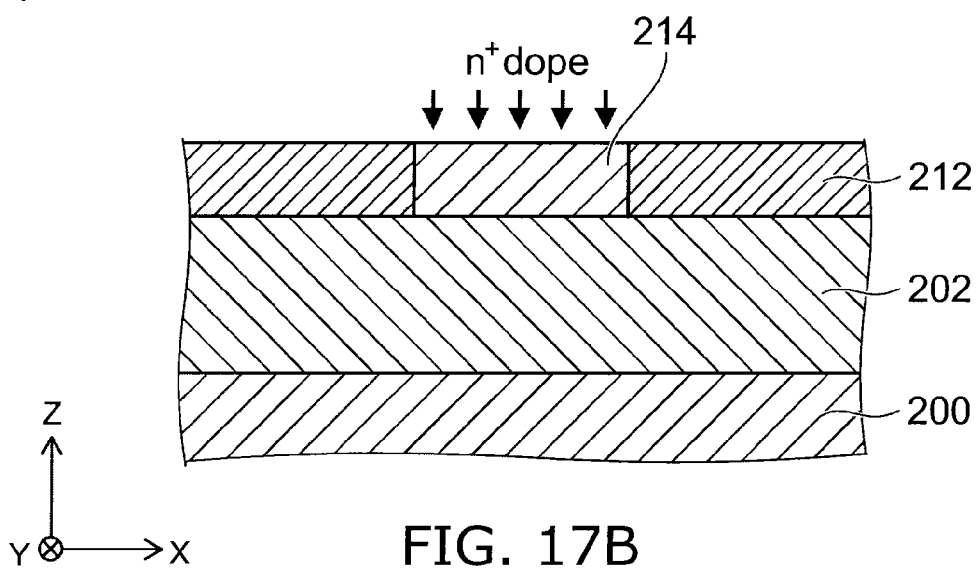
Figure 17C:
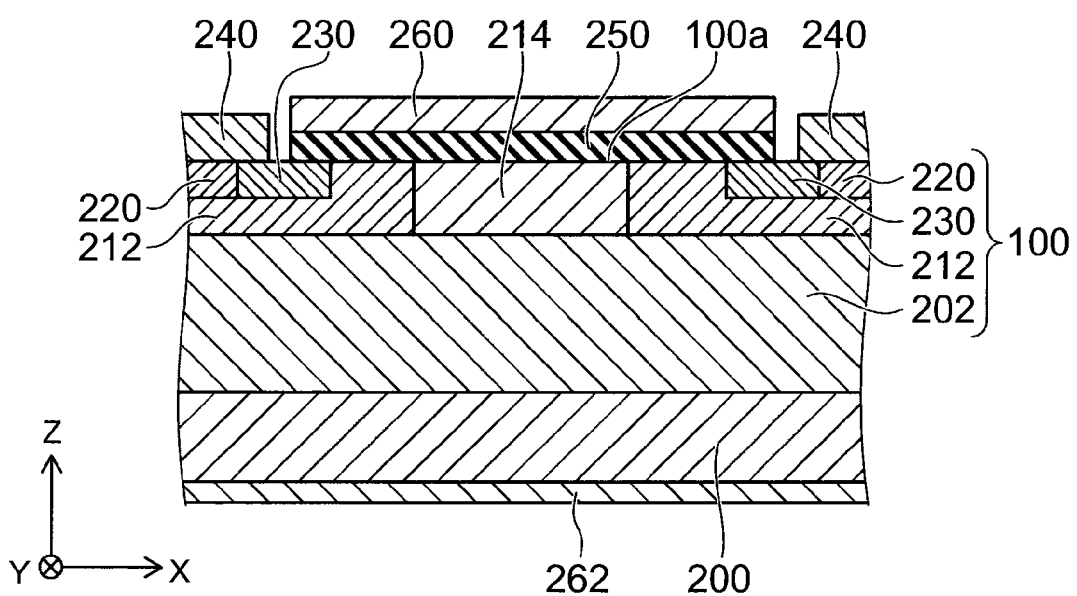

FIGS. 17A to 17C are schematic sectional views illustrating the method for manufacturing a semiconductor device according to the third embodiment.

In forming a first semiconductor region of step S300, as shown in FIG. 17A, on the surface of a substrate 200 of n$^+$-SiC, a first semiconductor region 202 as an n$^-$-SiC semiconductor layer is formed.

In forming a second semiconductor region of step S302, as shown in FIG. 17A, a second semiconductor region 212 as a p$^-$-SIC semiconductor layer is epitaxially grown on the first semiconductor region 202. The second semiconductor region 212 is formed to a film thickness of e.g. 0.6 µm.

In the second semiconductor region 212, the impurity concentration of the region having a film thickness of 0.4 µm on the substrate 200 side is set to e.g. $4 \times 10^{17}$/cm$^3$. In the second semiconductor region 212, the impurity concentration of the region having a film thickness of 0.2 µm on the opposite side from the substrate 200 is set to e.g. $1 \times 10^{16}$/cm$^3$. That is, preferably, the concentration on the substrate side is made higher, and the concentration of the portion constituting a channel is made lower. As the p-type impurity, for instance, Al is used.

In forming a fifth semiconductor region of step S304, as shown in FIG. 17B, an n-type impurity (e.g., N) is selectively ion implanted into the second semiconductor region 212 to form a fifth semiconductor region 214 as an n$^+$-SiC semiconductor region.

Specifically, first, a mask is formed on the second semiconductor region 212. For instance, a polysilicon film is grown on the second semiconductor region 212. After a prescribed resist mask process, the polysilicon film is patterned. This patterning of polysilicon is performed under an etching condition of strong anisotropy (e.g., reactive ion etching). Because of anisotropic etching, the mask is patterned in a rectangular shape.

Then, this mask is used to perform ion implantation of e.g. N. Thus, part of the second semiconductor region 212 is converted to n-type. The region converted to n-type reaches the first semiconductor region 202 therebelow. The region converted to n-type is a fifth semiconductor region 214.

The subsequent process is similar to that of the method for manufacturing the semiconductor device 110 according to the first embodiment. Thus, as shown in FIG. 17C, a semiconductor device 130 according to the third embodiment is completed. In the semiconductor device 130, ion implantation of the MOS channel region is not needed. This suppresses degradation of the MOS interface due to ion implantation.

Fourth Embodiment

Figure 18:
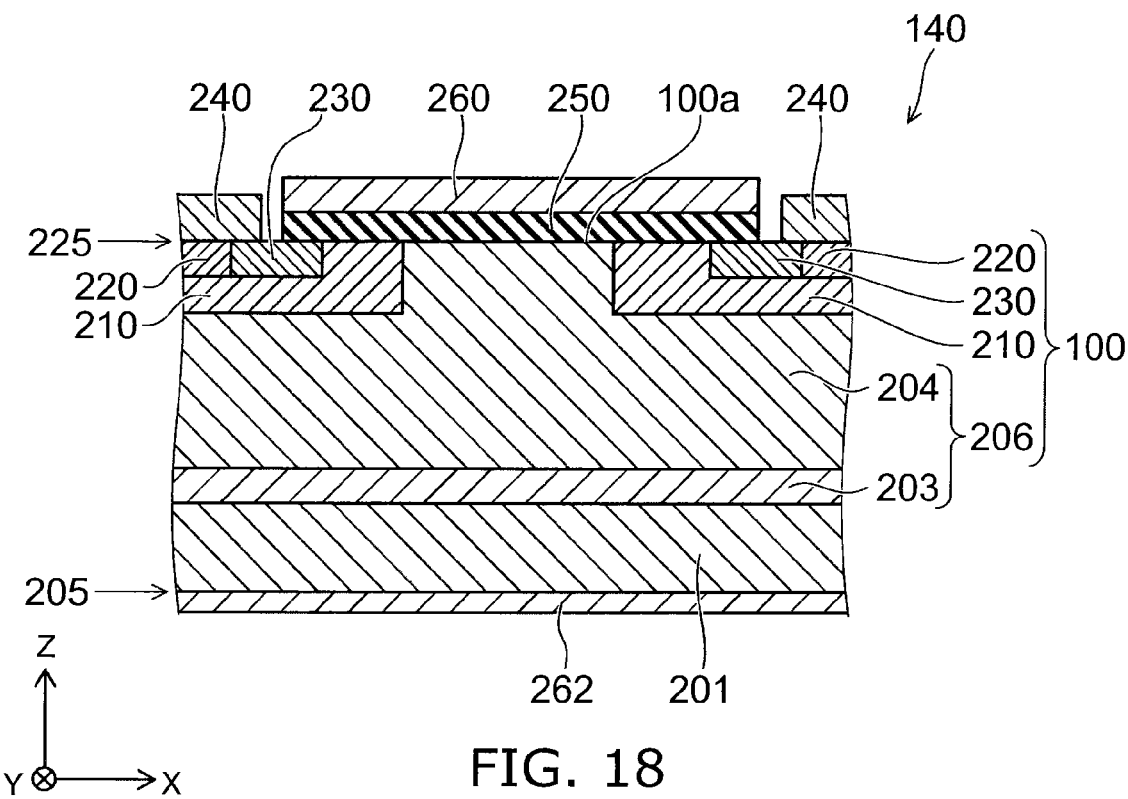
FIG. 18 is a schematic sectional view illustrating a semiconductor device according to a fourth embodiment.

FIG. 18 is a schematic sectional view illustrating a semiconductor device according to a fourth embodiment.

As shown in FIG. 18, the semiconductor device 140 according to the fourth embodiment is an IGBT (insulated gate bipolar transistor) based on SiC. In the semiconductor device 140, a substrate 201 of p-type (p$^+$) SiC is used instead of the substrate 200 of n-type (n$^+$) SiC in the semiconductor device 110. In the semiconductor device 140, an n-type semiconductor layer 206 is used instead of the first semiconductor region 202 of the semiconductor device 110. The n-type semiconductor layer 206 has a stacked structure of an n+-semiconductor layer 203 made of n+-SiC and an n−-semiconductor layer 204 made of n−-SiC.

In the semiconductor device 140, on the substrate 201 of high concentration p-type (p+) SiC, an n+-semiconductor layer 203 of high concentration n-type (n+) SiC. Then, on the n+-semiconductor layer 203, an n−-semiconductor layer 204 of low concentration n-type (n−) SiC is formed. The n-type semiconductor layer 206 is a breakdown voltage holding layer of the semiconductor device 140.

In the semiconductor device 140, a second electrode 262 including a conductive material is connected to the back surface of the substrate 201. The second electrode 262 is e.g. a collector electrode of the IGBT. In the back surface of the substrate 201, Si ions are implanted. In the substrate 201, the portion in which the area density of the dopant (e.g., Al) is maximized is provided in the interface portion between the substrate 201 and the second electrode 262. The second electrode 262 is ohmically connected to the back surface of the substrate 201.

In the semiconductor device 140, the first electrode 240 is e.g. an emitter electrode of the IGBT. As described above, the first electrode 240 is ohmically connected to the third semiconductor region 230 made of n-type (n+) SiC and the fourth semiconductor region 220 made of p-type (p+) SiC.

In the semiconductor device 140, by pinning of each of the first electrode 240 as an emitter electrode and the second electrode 262 as a collector electrode, resistance reduction can be achieved for each of the first electrode 240 and the second electrode 262. Furthermore, contacts can be formed from the same metal material on both the third semiconductor region 230 and fourth semiconductor region 220.

The fourth embodiment can realize a fourth resistance reduction (resistance reduction of the junction between the third semiconductor region 230 as an n-type SiC region and the first electrode 240 constituting an emitter electrode), a fifth resistance reduction (resistance reduction of the junction between the fourth semiconductor region 220 as a p-type SiC region and the first electrode 240 constituting an emitter electrode), and a sixth resistance reduction (resistance reduction of the junction between the substrate 201 as a p-type SiC region and the second electrode 262 constituting a collector electrode).

The fourth embodiment is not limited thereto. That is, the fourth embodiment may be configured to realize only one or two of the fourth resistance reduction, the fifth resistance reduction, and the sixth resistance reduction.

Figure 19:
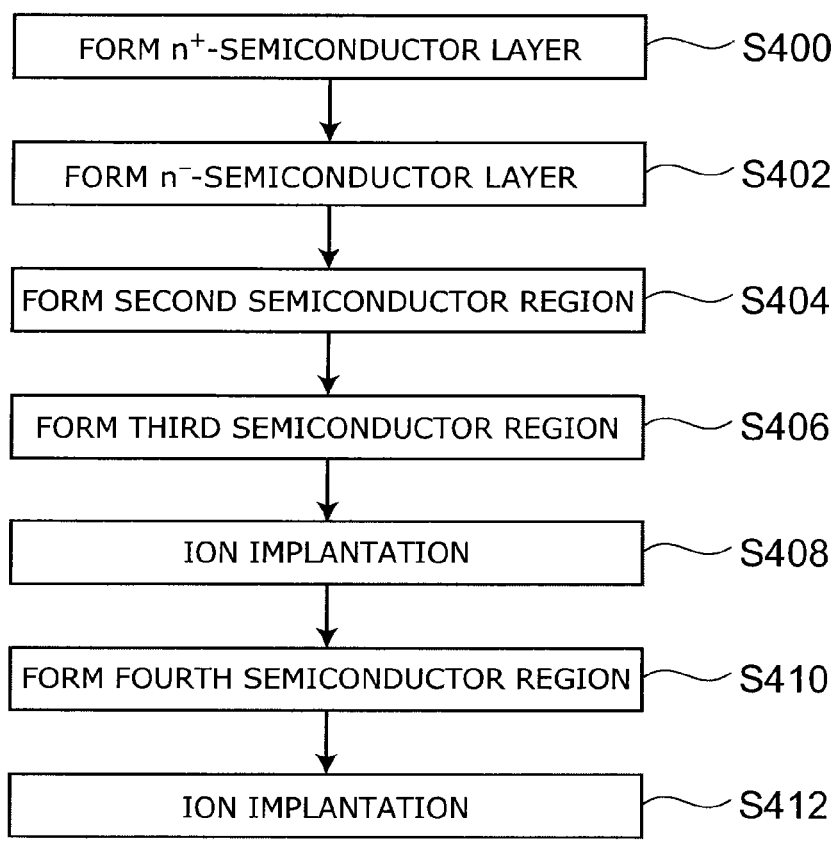
FIG. 19 is a flow chart illustrating a method for manufacturing a semiconductor device according to the fourth embodiment.

FIG. 19 is a flow chart illustrating a method for manufacturing a semiconductor device according to the fourth embodiment.

As shown in FIG. 19, the method for manufacturing a semiconductor device according to the fourth embodiment includes forming an n+-semiconductor layer (step S400), forming an n−-semiconductor layer (step S402), forming a second semiconductor region (step S404), forming a third semiconductor region (step S406), ion implantation (step S408), forming a fourth semiconductor region (step S410), and ion implantation (step S412). The process after ion implantation of step S412 is similar to that of the method for manufacturing the semiconductor device 110 according to the first embodiment shown in FIG. 3.

In forming an n+-semiconductor layer of step S400, on the substrate 201, an n+-semiconductor layer 203 made of n+-SiC is formed. The n+-semiconductor layer 203 is formed by epitaxial growth. The impurity (dopant) added to the n+-semiconductor layer 203 is e.g. N.

In forming an n−-semiconductor layer of step S402, on the n+-semiconductor layer 203, an n−-semiconductor layer 204 made of n−-SiC is formed. The n−-semiconductor layer 204 is formed by epitaxial growth. The film thickness of the n−-semiconductor layer 204 is e.g. 0.5 μm or more and 20 μm or less. In this embodiment, the film thickness of the n−-semiconductor layer 204 is e.g. 10 μm.

Forming a second semiconductor region (step S404), forming a third semiconductor region (step S406), ion implantation (step S408), forming a fourth semiconductor region (step S410), ion implantation (step S412), and the process after ion implantation of step S412 are similar to those of the method for manufacturing the semiconductor device 110 according to the first embodiment shown in FIG. 3.

In the step of forming the second electrode 262, an electrode 262 constituting a collector electrode is formed on the back surface of the substrate 201 being a p+-SiC semiconductor substrate. Here, implanting Si ions into the back surface of the substrate 201, forming a second electrode 262, and annealing are similar to those of the first embodiment.

However, at the interface between the substrate 201 and the second electrode 262, pileup of the dopant (such as Al) is formed. That is, the semiconductor device 140 has a structure in which the dopant (such as Al) is piled up at the interface between the substrate 201 and the second electrode 262.

In low temperature annealing performed after forming the second electrode 262, heat treatment at 400° C. is performed. The low temperature annealing is performed in e.g. Ar gas with a heating time of 5 minutes. By such heat treatment, the dopant is collected (piled up) at the interface between the electrode 262 and the substrate 201. At this time, NiSi is thinly formed near the interface. However, the localized dopant is piled up at the interface with SiC to form ohmic connection. The dopant is in a localized state, which is different from the normal non-localized state of the dopant.

In the fourth embodiment, a high performance IGBT can be obtained. The semiconductor device 140 is an IGBT, subjected to bipolar operation. Thus, conductivity modulation occurs, and reduces the on-resistance. As a result, the current carrying capacity can be made significantly higher than in the aforementioned DiMOSFET.

Here, not only the electron current but also the hole current flows. Thus, it is very important to reduce the contact resistance between the emitter electrode and the p+-region. According to the fourth embodiment, a sufficiently low contact resistance can be obtained. Thus, the technique of the fourth embodiment is very effective in IGBT device fabrication with fine processing in the future.

Fifth Embodiment

Figure 20:
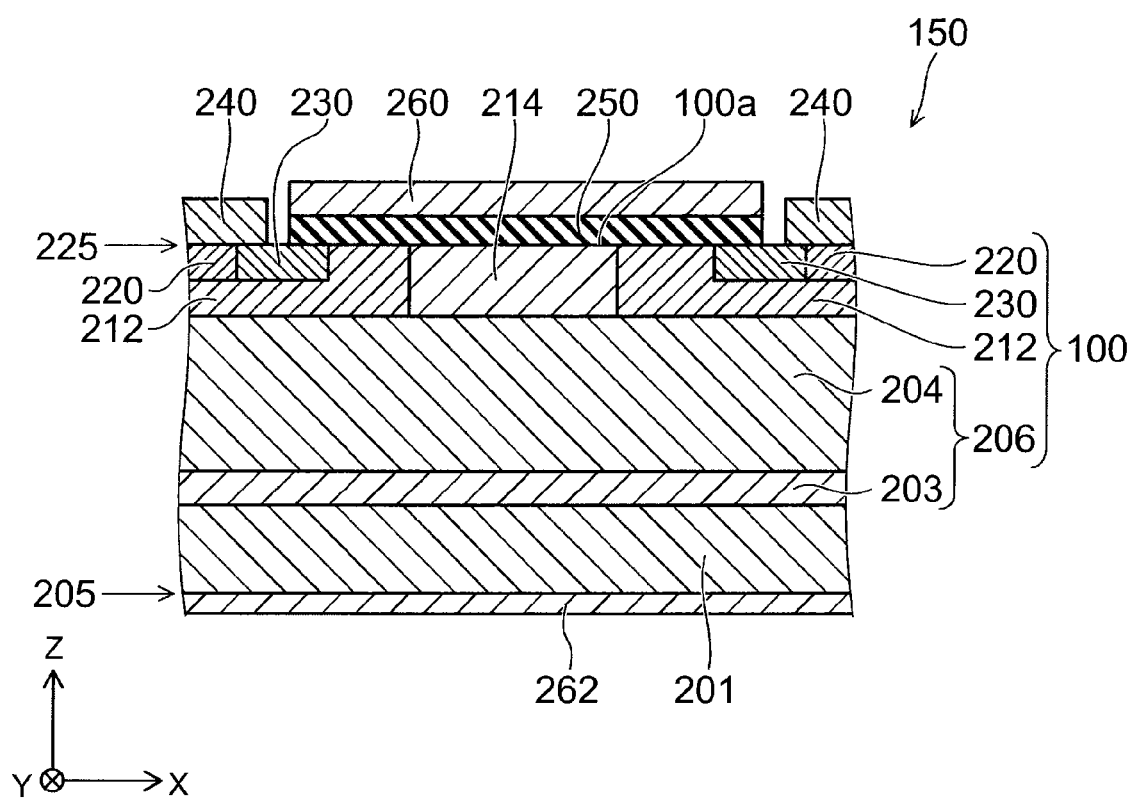
FIG. 20 is a schematic sectional view illustrating a semiconductor device according to a fifth embodiment.

FIG. 20 is a schematic sectional view illustrating a semiconductor device according to a fifth embodiment.

As shown in FIG. 20, the semiconductor device 150 according to the fifth embodiment is different from the semiconductor device 140 according to the fourth embodiment in that a fifth semiconductor region 214 is provided, and that a second semiconductor region 212 is formed by epitaxial growth.

Figure 21:
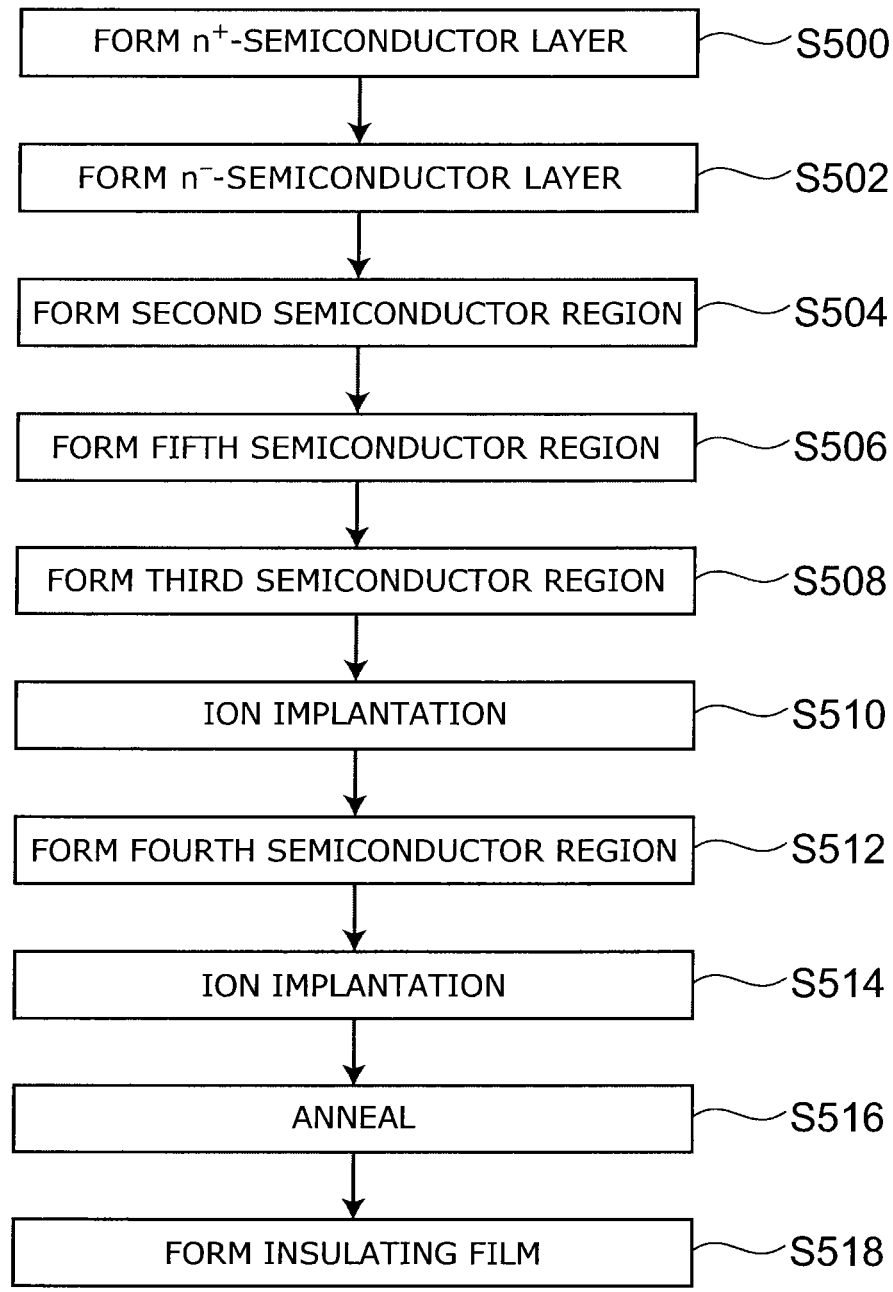
FIG. 21 is a flow chart illustrating a method for manufacturing a semiconductor device according to the fifth embodiment.

FIG. 21 is a flow chart illustrating a method for manufacturing a semiconductor device according to the fifth embodiment.

As shown in FIG. 21, the method for manufacturing a semiconductor device according to the fifth embodiment includes forming an n+-semiconductor layer (step S500), forming an n−-semiconductor layer (step S502), forming a second semiconductor region (step S504), forming a fifth semiconductor region (step S506), forming a third semiconductor region (step S508), ion implantation (step S510), forming a fourth semiconductor region (step S512), ion implantation (step S514), annealing (step S516), and forming an insulating film (step S518).

Forming an n$^+$-semiconductor layer (step S500) and forming an n$^-$-semiconductor layer (step S502) are similar to steps S400-S402 shown in FIG. 19. The process after forming a third semiconductor region (step S508) is similar to that of the method for manufacturing the semiconductor device 110 according to the first embodiment shown in FIG. 3. The step of forming a second electrode 262 is similar to that of the fourth embodiment.

In forming a second semiconductor region of step S504, as shown in FIG. 20, a second semiconductor region 212 as a p$^-$-SiC semiconductor layer is epitaxially grown on the n$^-$-semiconductor layer 204.

In forming a fifth semiconductor region of step S506, as shown in FIG. 20, an n-type impurity (e.g., N) is selectively ion implanted into the second semiconductor region 212 to form a fifth semiconductor region 214 as an n$^+$-SiC semiconductor region.

In the semiconductor device 150 according to the fifth embodiment, as in the semiconductor device 140 according to the fourth embodiment, a high performance IGBT can be obtained. Furthermore, in the semiconductor device 150 according to the fifth embodiment, ion implantation of the MOS channel region is not needed. This suppresses degradation of the MOS interface due to ion implantation.

Sixth Embodiment

Figure 22A:
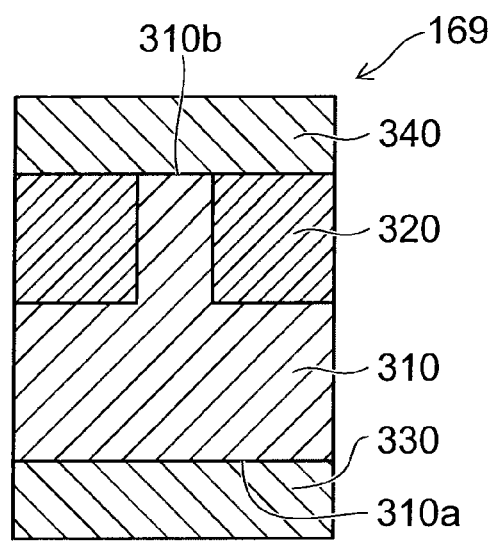
FIG. 22A to FIG. 22C are schematic sectional views illustrating diodes.
Figure 22B:
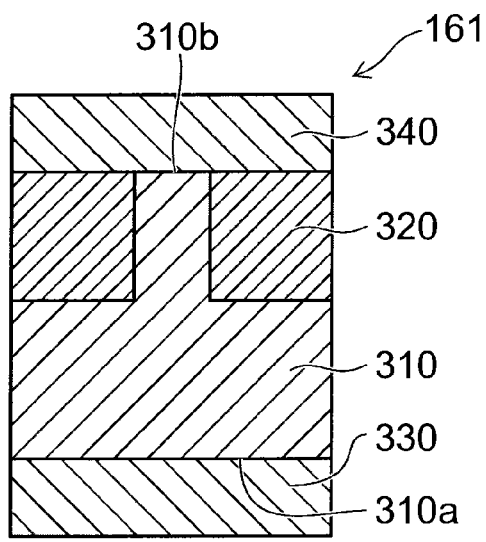
Figure 22C:
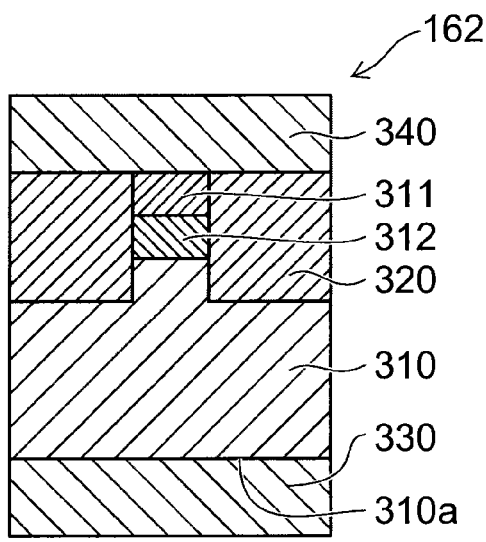

FIGS. 22A to 22C are schematic sectional views illustrating diodes.

FIG. 22A shows a typical diode 169. FIGS. 22B and 22C show diodes 161 and 162 according to a sixth embodiment.

The typical diode 169 shown in FIG. 22A includes an n$^-$-type semiconductor region 310, a p$^+$-type semiconductor region 320 provided on part of the n$^-$-type semiconductor region 310, a cathode electrode 330 in contact with the lower surface 310a of the n$^-$-type semiconductor region 310, and an anode electrode 340 in contact with the p$^+$-type semiconductor region 320 and the upper surface 310b of the n$^-$-type semiconductor region 310. In the diode 169, the anode electrode 340 forms a Schottky junction with the p$^+$-type semiconductor region 320 and the upper surface 310b of the n$^-$-type semiconductor region 310.

As shown in FIG. 22B, like the diode 169, the diode 161 includes an n$^-$-type semiconductor region 310, a p$^+$-type semiconductor region 320, a cathode electrode 330, and an anode electrode 340. In the diode 161, in forming the p$^+$-type semiconductor region 320, not only Al as a dopant is ion implanted, but also Si is coimplanted near the surface. Then, annealing is performed after forming the anode electrode 340. Thus, the p$^+$-type semiconductor region 320 and the anode electrode 340 are brought into ohmic contact. In the diode 161, it is only necessary to appropriately select a Schottky electrode in contact with the upper surface 310b of the n$^-$-type semiconductor region 310. That is, in the diode 161, ohmic contact with the p$^+$-type semiconductor region 320 is formed irrespective of the electrode.

As shown in FIG. 22C, the diode 162 includes an n$^-$-type semiconductor region 310, a p$^+$-type semiconductor region 320 provided on part of the n$^-$-type semiconductor region 310, an n$^+$-type semiconductor region 311 juxtaposed with the p$^+$-type semiconductor region 320 on part of the n$^-$-type semiconductor region 310, a p$^-$-type semiconductor region 312 provided between the n$^+$-type semiconductor region 311 and the n$^-$-type semiconductor region 310, a cathode electrode 330 in contact with the lower surface 310a of the n$^-$-type semiconductor region 310, and an anode electrode 340 in contact with the p$^+$-type semiconductor region 320 and the upper surface 310b of the n$^+$-type semiconductor region 311.

In the diode 162, in forming the p$^+$-semiconductor region 320, not only Al is introduced by ion implantation and the like, but also Si is coimplanted near the surface. Furthermore, in forming the n$^+$-semiconductor region 311, not only P is introduced by ion implantation and the like, but also Si is coimplanted near the surface. Then, annealing is performed after forming the anode electrode 340. Thus, the p$^+$-semiconductor region 320 and the n$^+$-semiconductor region 311 are both brought into ohmic contact. Here, ohmic contact is achieved irrespective of the work function of the electrode. Thus, any electrode material may be used. For instance, materials having good processing characteristics, such as TiN and W, can also be selected.

As described above, in the semiconductor device and the method for manufacturing the same according to the embodiments, a low contact resistance can be obtained between the semiconductor region and the electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first semiconductor part made of SiC containing a first element, the first element being a first impurity of one of an n-type and a p-type, the first semiconductor part including a first region and a second region; and
    a conductive electrode electrically connected to the first semiconductor part, the conductive electrode having a direct contact with the first region,
    the first region being provided between the conductive electrode and the second region,
    a thickness of the first region in a first direction from the semiconductor part toward the conductive electrode being not more than one nanometer, and
    a first area density of the first element in the first region is higher than a second area density of the first element in the second region.

2. The device according to claim 1, wherein the first element includes at least one of B, Al, and Ga.

3. The device according to claim 2, wherein the first area density is not less than $9.4 \times 10^{13}$ cm$^{-2}$ and not more than $1.22 \times 10^{15}$ cm$^{-2}$.

4. The device according to claim 2, wherein the first element is provided in a C site of SiC.

5. The device according to claim 1, wherein the first element includes at least one of N, P, and As.

6. The device according to claim 5, wherein the first area density is not less than $0.56 \times 10^{13}$ cm$^{-2}$ and not more than $1.22 \times 10^{15}$ cm$^{-2}$.

7. The device according to claim 5, wherein
the first element is one of P and As, the first element is provided in a C site of SiC.

8. The device according to claim 5, wherein
the first element is N, and
the first element is provided in an Si site of SiC.

9. The device according to claim 1, wherein distribution of the area density of the first element in depth direction of the second region includes a portion having a maximum area density of the first element.

10. The device according to claim 1, further comprising:
a second semiconductor part arranged with the first semiconductor part in a second direction crossing the first direction,
the second semiconductor part including SiC containing a second element, the second element being a second impurity of the other one of the n-type and the p-type,
the second semiconductor part including a third region and a fourth region,
the conductive electrode being electrically connected to the second semiconductor part and having a direct contact with the third region,
the third region being provided between the conductive electrode and the fourth region,
a thickness of the third region in the first direction being not more than one nanometer, and
a third area density of the second element in the third region is higher than a fourth area density of the second element in the fourth region.

11. The device according to claim 10, wherein
the first element includes at least one of B, Al, and Ga, and
the second element includes at least one of N, P, and As.

12. The device according to claim 10, wherein
the first area density is not less than $9.4 \times 10^{13}$ cm$^{-2}$ and not more than $1.22 \times 10^{15}$ cm$^{-2}$, and
the third area density is not less than $0.56 \times 10^{13}$ cm$^{-2}$ and not more than $1.22 \times 10^{15}$ cm$^{-2}$.

13. The device according to claim 11, wherein
the first element is provided in a C site of SiC,
the second element is provided in an Si site of SiC, and
the second element includes N.

14. The device according to claim 11, wherein
the first element is provided in a C site of SiC,
the second element is provided in a C site of SiC, and
the second element includes one of P and As.

15. A semiconductor device comprising:
a substrate made of SiC;
a first semiconductor region of a first conductivity type provided on the substrate, the first semiconductor region including SiC;
a second semiconductor region of a second conductivity type provided on a part of the first semiconductor region, the second semiconductor region including SiC;
a third semiconductor region provided on a part of the second semiconductor region, the third semiconductor region including SiC containing a first element as an impurity of the first conductivity type, the third semiconductor region including a first region and a second region;
a fourth semiconductor region provided on a part of the second semiconductor region, the fourth semiconductor region arranged with the third semiconductor region in a second direction crossing a first direction from the substrate toward the first semiconductor region, and the fourth semiconductor region including SiC containing a second element as an impurity of the second conductivity type, the fourth semiconductor region including a third region and a fourth region;
an insulating film provided on the second semiconductor region;
a control electrode provided on the insulating film;
a first conductive electrode electrically connected to the first interface part and the second interface part configured, the first conductive electrode having a direct contact with the first region and having a direct contact with the third region; and
a second conductive electrode electrically connected to the substrate,
the first region being provided between the first conductive electrode and the second region,
a thickness of the first region in the first direction being not more than one nanometer,
a first area density of the first element in the first region is higher than a second area density of the first element in the second region,
the third region being provided between the first conductive electrode and the fourth region,
a thickness of the third region in the first direction being not more than one nanometer, and
a third area density of the second element in the third region is higher than a fourth area density of the second element in the fourth region.

16. The device according to claim 15, wherein
the first element includes at least one of N, P, and As,
the second element includes at least one of B, Al, and Ga,
the first area density is not less than $0.56 \times 10^{13}$ cm$^{-2}$ and not more than $1.22 \times 10^{15}$ cm$^{-2}$, and
the second area density is not less than $9.4 \times 10^{13}$ cm$^{-2}$ and not more than $1.22 \times 10^{15}$ cm$^{-2}$.

17. The device according to claim 15, wherein
the first element includes at least one of P and As,
the second element includes at least one of B, Al, and Ga,
the second element is provided in a C site of SiC, and
the first element is provided in a C site of SiC.

18. The device according to claim 16, wherein conductivity type of the substrate is the second conductivity type.

19. The device according to claim 15, wherein
the first element includes N,
the second element includes at least one of B, Al, and Ga,
the second element is provided in a C site of SiC, and
the first element is provided in an Si site of SiC.

* * * * *